United States Patent
Murabayashi et al.

[11] Patent Number: 5,841,300
[45] Date of Patent: Nov. 24, 1998

[54] SEMICONDUCTOR INTEGRATED CIRCUIT APPARATUS

[75] Inventors: Fumio Murabayashi, Hatano; Tatsumi Yamauchi, Hitachioota; Takashi Hotta; Hiromichi Yamada, both of Hatano, all of Japan

[73] Assignee: Hitachi, Ltd., Tokyo, Japan

[21] Appl. No.: 838,193

[22] Filed: Apr. 16, 1997

Related U.S. Application Data

[63] Continuation of Ser. No. 423,374, Apr. 18, 1995, abandoned.

[30] Foreign Application Priority Data

Apr. 18, 1994 [JP] Japan .................................. 6-078363
Sep. 14, 1994 [JP] Japan .................................. 6-219809

[51] Int. Cl.$^6$ .................................................. H03K 19/096
[52] U.S. Cl. ................................ 326/98; 326/17; 326/28
[58] Field of Search .................................. 326/95–98, 17, 326/21, 112, 119, 121, 27–28; 327/544

[56] References Cited

U.S. PATENT DOCUMENTS

| | | | |
|---|---|---|---|
| 4,451,745 | 5/1984 | Itoh et al. | 326/98 |
| 4,780,626 | 10/1988 | Guerin et al. | 326/98 |
| 4,899,066 | 2/1990 | Aikawa et al. | 326/98 |
| 5,144,162 | 9/1992 | Tran | 326/98 |
| 5,208,489 | 5/1993 | Houston | 326/98 |
| 5,300,831 | 4/1994 | Pham et al. | 327/544 |
| 5,402,012 | 3/1995 | Thomas | 326/97 |
| 5,612,638 | 3/1997 | Lev | 326/121 |

FOREIGN PATENT DOCUMENTS 2-277315  11/1990  Japan .

*Primary Examiner*—Jon Santamauro
*Attorney, Agent, or Firm*—Antonelli, Terry, Stout & Kraus, LLP

[57] ABSTRACT

The present invention is intended to provide a conventional circuit apparatus which is highly tolerant to noises and operates at a higher speed than a completely complementary static CMOS circuit. To achieve this, circuit apparatus according to the present invention is provided with a plurality of CMOS static logic circuits which are series-connected and potential setting means which is connected to the output parts of these logic circuits and sets the outputs of the output parts to a low level in synchronization with a clock signal, thus propagating signals by operation of the NMOS circuit. In other words, a signal propagation delay occurs only when the N-type logic block conducts. Therefore circuit operation is speeded up and α particle noise and noises due to charge redistribution effect or leakage current can be prevented.

37 Claims, 22 Drawing Sheets

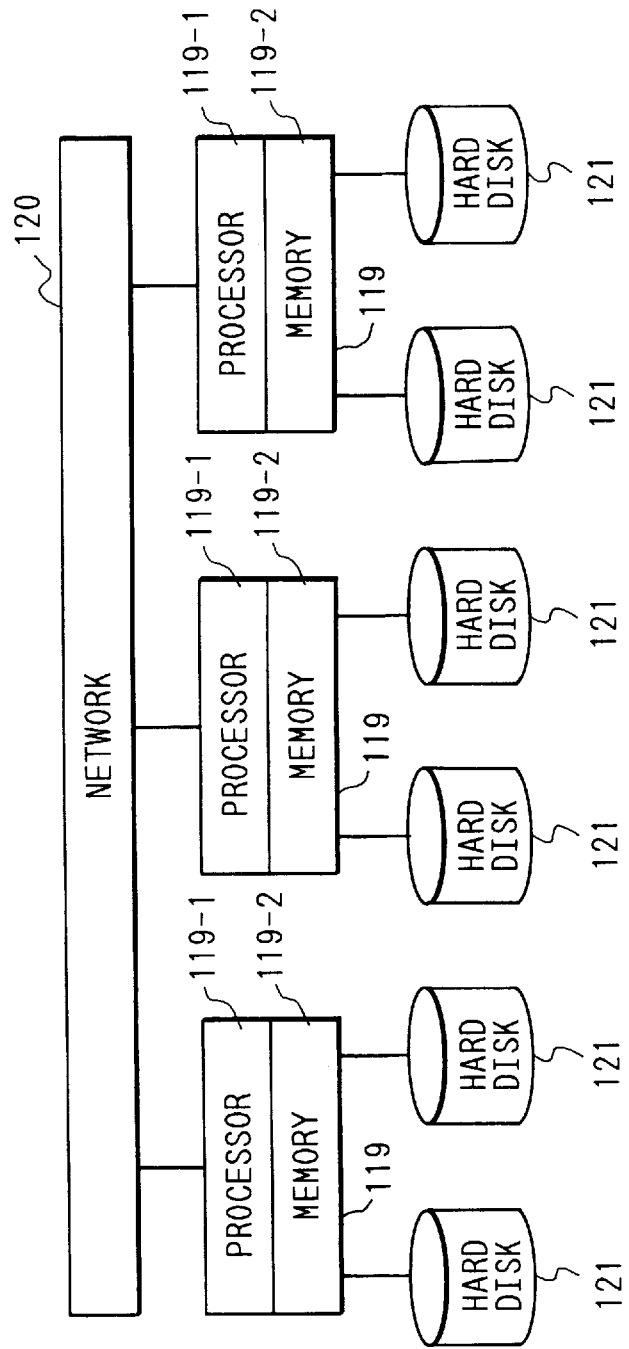

SEMICONDUCTOR INTEGRATED CIRCUIT APPARATUS

This is a continuation of application Ser. No. 08/423,374, filed Apr. 18, 1995, now abandoned.

BACKGROUND OF THE INVENTION

1. Field of the Invention

The present invention relates to a semiconductor integrated circuit apparatus which forms elements such as a central processing unit, peripheral units and memory units which are components of a computer and, more particularly, a semiconductor integrated circuit apparatus such as, for example, a semiconductor integrated circuit apparatus for use in a parallel computer and aerospace applications which are required to provide high reliability and performance.

2. Description of the Related Art

Lately, computers have been remarkably advanced in their performance. A representative circuit technology which has supported such progress of computer performance is found in completely complementary static CMOS (complementary metal oxide semiconductor) circuits. The completely complementary static AMOS circuit requires less power consumption and excels in high efficiency of integration, as compared with a bipolar transistor circuit. As, well known, such CMOS circuits comprised of a P-type logic block composed of P-type MOS transistors and an N-type logic block composed of N-type MOS transistors which are connected in series, wherein the two logic blocks operate complementarily. A rise time of an output signal depends on the characteristics of the PMOS transistors and a fall time of the output signal depends on the characteristics of the NMOS transistors. Generally, a gain factor β of the PMOS transistors is smaller than the gain factor β of the NMOS transistors. Accordingly, if a channel widths and a channel lengths of the PMOS transistor and NMOS transistors are designed to be equal, the rise time of the output signal is longer than the fall time. On the contrary, the channel widths of PMOS transistors need to be larger than the channel widths of NMOS transistor to make the rise time and the fall time of the output signal equal, resulting in an increase of input capacitance and area.

A CMOS domino logic circuit is one example of a circuit for solving a problem of the above-described completely complementary static CMOS circuit (R. H. Krambeck, Charles M. Lee and Hung-Fai Stephen Law, "High-speed Compact Circuits with CMOS", IEEE JOURNAL OF SOLID-STATE CIRCUITS, VOL. SC-17, NO. 3, 1982). An example of such as CMOS domino circuit is shown in FIG. 9. The CMOS domino circuit is a dynamic circuit which forms a logic circuit using only NMOS transistors. Accordingly, a delay in signal propagation depends on the characteristics of the NMOS transistors. In the CMOS domino circuit, there is no problem of an increase of the delay time resulting from the P-type logic block which is the problem in the completely complementary static CMOS circuit. Since the logic is formed only with the NMOS logic block and the input capacitance and the parasitic capacitance in the circuit, the operation is carried out at a high speed and the area is small.

However, the CMOS domino circuit includes the following three problems. The first problem is that, since the CMOS domino circuit is a dynamic circuit, it is very susceptible to α particle noise. A circuit diagram and operating waveform for such a circuit are shown in FIG. 10. The CMOS domino circuit precharges a clock signal to be entered into the circuit during a period when the clock signal remains at a low level, and the logic is propagated during the period when the clock signal remains at a high level. When an input signal is at a low level while the clock signal remains at a high level for a logic decision, a node point A remains at a high level and the charge at the point A is dynamically maintained. At this time, if α particles hit the drain of the N-type transistor 100, the charge at the point A is discharged and the potential level at the point A lowers. There is no path for charging the discharged electric charge. Therefore the potential level, which has been lowered, does not return to the previous level, and a faulty operation results.

The second problem is that the CMOS domino circuit, which is a dynamic circuit, is susceptible to the leakage current noise. When an input signal is at a low level while the clock signal remains at a high level for determination of the logic, a node point A remains at a high level and the charge at the point A is dynamically maintained. At this time, the charge at the point A is discharged by the leakage current through the N-type transistor and the potential level at the point A lowers. There is no path for charging the discharged electric charge and therefore the potential level, which has been lowered, does not return to the previous level and a faulty operation results.

The third problem is a problem related to a charge redistribution effect as shown in FIG. 11. A capacitance of the node point A of the CMOS domino circuit is assumed as CA and a capacitance of the node point B is assumed as CB. If the input signal A is at the low level and the input signal B is at the high level in the logic decision period 1, the potential of the node point A remains at the high level "Vdd" and the potential of the node point B remains at the low level "0V". Since NMOS transistors 101 and 102 are kept off during the precharging period, the potential at the node point A remains at the high level "Vdd" and the potential at the node point B remains at "0V". When the input signal A is set to the high level in the logic decision period 2, the NMOS transistor A turns to ON, the charge is redistributed between the node point A and the node point B and the potential of the node points A and B is "(CA/(CA+CB)) Vdd". When the capacitances of CA and CB are substantially equal, the potential of the node points A and B is "(½) Vdd" which leads to a faulty operation.

As a means for solving the problems of the CMOS domino circuit such as, for example, α particle noise, leakage current and charge redistribution effect, there has been proposed a method for adding a feedback type pull-up PMOS transistor 103 shown in FIG. 12. The electric charge to be discharged due to α particle noise and charge redistribution effect is compensated by weakly pulling up the point A of the dynamic node with the feedback type pull-up PMOS transistor 103. However, when the N-type logic block 104 draws out the charge at the node point A to a low level, the feedback type pull-up PMOS transistor 103 prevents this drawing-out operation. The through current flows to cause not only the power consumption to increase but also the switching speed of the circuit to remarkably lower. Accordingly, this means impaired high speed operation and is therefore unsuitable for a system which requires high speed operation of the circuit.

A static circuit for speeding up the completely complementary static CMOS circuit by precharging in advance of the output is disclosed in Japanese Patent Application Disclosure Gazette BEI. 2-277315. However, this circuit comprises circuits for precharging the output to a high level voltage and circuits for precharging the output to a low level voltage which are alternately series-connected and operated and therefore PMOS transistors and NMOS transistors alternately operate and the signals cannot be propagated only through NMOS transistors.

As described above, though the CMOS domino circuit is proposed as a circuit which operates at a higher speed than the completely complementary static CMOS circuit, the CMOS domino circuit includes a problem that it is susceptible to noise. On the contrary, if the feedback type pull-up PMOS transistor is added to make the circuit strong against noise, these high speed operation of the circuit is impaired. To solve the problems, the present invention is intended to provide compatibility of high noise tolerance and high speed operation.

SUMMARY OF THE INVENTION

An object of the present invention is to provide a circuit which is not susceptible noise and which operates at a higher speed than the conventional completely complementary static CMOS circuit.

A semiconductor integrated circuit apparatus according to the present invention has a plurality of complementary static logic circuits which are series-connected to first and second sources and a potential setting means which is connected to respective output parts of these complementary static logic circuits and which sets outputs of the output parts to the second potential in synchronization with the clock signal.

An embodiment of the potential setting means has a precharge means, which is connected to the first source and sets the output part of the complementary static logic circuit to the first potential in synchronization with the clock signal, and an inverter for setting the output part, which is set to the first potential by this precharge means, to the second potential.

In addition, it is preferable that timing control means for controlling an operation timing of the complementary static logic circuit in synchronization with the clock signal is provided between the complementary static logic circuit and the second source.

According to another embodiment of the semiconductor integrated circuit apparatus of the present invention, the semiconductor integrated circuit apparatus is provided with a plurality of complementary MOS transistor blocks having MOS transistor blocks of one conductivity type which are connected to the first source and the output parts and which receive input signals supplied, and MOS transistor blocks of the opposite conductivity type which are connected to the output parts and the second source and which receive the input signal. The plurality of these complementary MOS transistor blocks are series-connected so that the output signal of the complementary MOS transistor block of the front step serve as the input signal for the complementary MOS transistor block of the rear step. A potential setting means for setting the output signal of the complementary MOS transistor block of the front step to the second potential is provided between complementary MOS transistor blocks, and the signals are propagated from the complementary MOS transistor block of the front step to the complementary MOS transistor block of the rear step by the operation of the opposite conductivity type MOS transistor.

In addition, according to a further another embodiment of the semiconductor integrated circuit apparatus of the present invention, the semiconductor integrated circuit apparatus has a plurality of logic blocks which substantially comprise MOS transistors and at least one of the plurality of these logic blocks has a plurality of complementary MOS transistor blocks which respectively comprise one conductivity type MOS transistor block, which is connected to the first source and the output part and receives input signals, and the opposite conductivity type MOS transistor block, which is connected to the above-described output part and the second source and receives input signals. The plurality of complementary MOS transistor blocks are series-connected so that the output signals of the complementary MOS transistor block of the front step serve as the input signals for the complementary MOS transistor block of the rear step. A potential setting means for setting the output signals of the complementary MOS transistor block of the front step to the second potential in synchronization with the clock signal is provided between these complementary MOS transistor blocks. Signals are propagated from the complementary MOS transistor block of the front step to the complementary MOS transistor block of the rear step according to the operation of the opposite conductivity type MOS transistor block.

A latch circuit which operates in synchronism with the clock signal to be entered into the potential setting means of the logic block of the front step is provided between these logic blocks. An inversion signal of a clock signal entered into the logic block of the rear step is used as a clock signal to be entered into the logic block of the front step.

An outline of an example of a preferable circuit to which the present invention applies is shown in FIG. 1. This example circuit comprises a P-type logic block 105 which is composed of at least one P-type field effect transistor having a source electrode and a drain electrode, which are series or parallel-connected between a first power supply terminal 111 and a first internal terminal 109, and a gate electrode connected to an input terminal 108 and an N-type logic block 106 which is composed of at least one N-type field effect transistor having a source electrode and a drain electrode, which are series or parallel-connected between a second power supply terminal 112 and the first internal terminal 109 and a gate electrode connected to the input terminal 108, wherein the P-type logic block 105 and the N-type logic block 106 form a completely complementary static CMOS circuit which performs complementary operation. An inverter circuit 138 is series-connected between the first internal terminal 109 and an output terminal 139. Further, an N-type field effect transistor 137 having a source electrode and a drain electrode, which are connected to the N-type logic block 106 and the second power supply terminal 112, and a gate electrode into which the clock signal CR is entered is connected therebetween, and a first precharging device 107 for precharging the first internal terminal 109 to the first power supply potential is connected between the first power supply terminal 111 and the first internal terminal 109. The clock signal CK is entered into the control terminal of the precharging device 107.

Operation and effects of the present invention are described below, referring to FIG. 1. In FIG. 1, the potential of the first power supply terminal 111 is assumed as Vdd (hereafter referred to as "high level") and the potential of the second power supply terminal 112 is assumed as Vss (hereafter referred to as "low level"). When the potential of the clock signal CK110 is a low level, the precharging device 107 turns on, and the potential of the first internal terminal 109 is set to the high level and the potential of the output terminal 139 is set to the low level. Since the N-type field effect transistor 137 remains off even when the signal of the input terminal 108 changes during a period when the potential of the clock signal CK remains at the low level, the potential of the output terminal 139 remains unchanged at the low level. If the input signal changes from the low level to the high level when the potential of the clock signal CK has the high level and the N-type field effect transistor 137 is on, the N-type logic block 106 turns on, the potential of the first internal terminal 109 changes to the low level and the potential of the output terminal 139 changes to the high level. On the contrary, even though the input signal changes from the high level to the low level and the P-type logic block turns on, the potential of the output does not change since the first internal terminal is originally set at the high level. Accordingly, the output signal changes in accordance with the input signal only when the input signal changes from the low level to the high level and the N-type logic block turns on. As described above, the gain factor β of the N-type field effect transistor is higher than the gain factor β of the P-type field effect transistor and, in other words, this circuit in which signal propagation is delayed only when the N-type logic block 106 turns on operates at a high speed. The P-type field effect transistor which forms the P-type logic block suffices to compensate the leakage current of the N-type logic block 106 and the external noise current and has nothing to do with propagation of input signals. For this reason, the P-type field effect transistor does not require a large load driving force and therefore the channel width of the P-type field effect transistor which forms the P-type logic block can be designed to be sufficiently smaller than the channel width of the N-type field effect transistor. In other words, an input capacitance of the circuit according to the present invention and the junction capacitance of the P-type field effect transistor can be reduced to enable high speed operation.

The other effect of the circuit of the present invention is high noise tolerance. In the circuit according to the present invention, the P-type logic block 105 which is comprised of P-type field effect transistors and the N-type logic block 106 which is comprised of N-type field effect transistors are series-connected between the first power supply terminal 111 and the second power supply terminal 112 as described above, and the P-type logic block 105 and the N-type logic block 106 form the completely complementary static CMOS circuit which performs complementary operation. Accordingly, the circuit according to the present invention does not dynamically maintain the charge, and this differs from the CMOS domino circuit shown as the above-described example of the prior art. Then, even though the leakage current, α particle noise, charge redistribution effect or noise due to the power supply line and the signal line occurs in the circuit according to the present invention, the P-type logic block 105 and the N-type logic block 106 which perform static complementary operation always pull up or down the first internal terminal 109 to the first or second power supply potential to enable minimization of the noise. Thus even if the output potential is inverted by noise, the output potential can be restored to a proper potential level. Therefore high noise tolerance can be obtained.

BRIEF DESCRIPTION OF THE DRAWINGS

FIG. 2 is a diagram showing an embodiment of a parallel computer system to which the present invention applies;

DESCRIPTION OF THE PREFERRED EMBODIMENTS

FIG. 2 shows an example of a parallel computer system formed according to the present invention. A plurality of central processing units 119, each comprising a processor and a memory, are connected by a connection network 120 to form one computer system. The central processing units 119 are also connected to the hard discs 121. A computer system with a manifold higher performance than a system comprising one central processing unit 119 can be materialized by connecting a plurality of the central processing units 119. In this case, several to several thousands of central processing units 119 may be connected. To make these central processing units 119 normally operate without failures for a long period of time, these central processing units 119 should respectively maintain high reliability. To build up a higher performance parallel computer system, the central processing units 119 should respectively provide high performance. In other words, the central processing unit 119 shown in the example of the parallel computer system should simultaneously provide high reliability and high speed operation. Therefore, the logic circuit according to the present invention which has high noise tolerance and high speed operation can be used as a logic circuit which forms the central processing unit 119 having the characteristics as described above.

Figure 3:
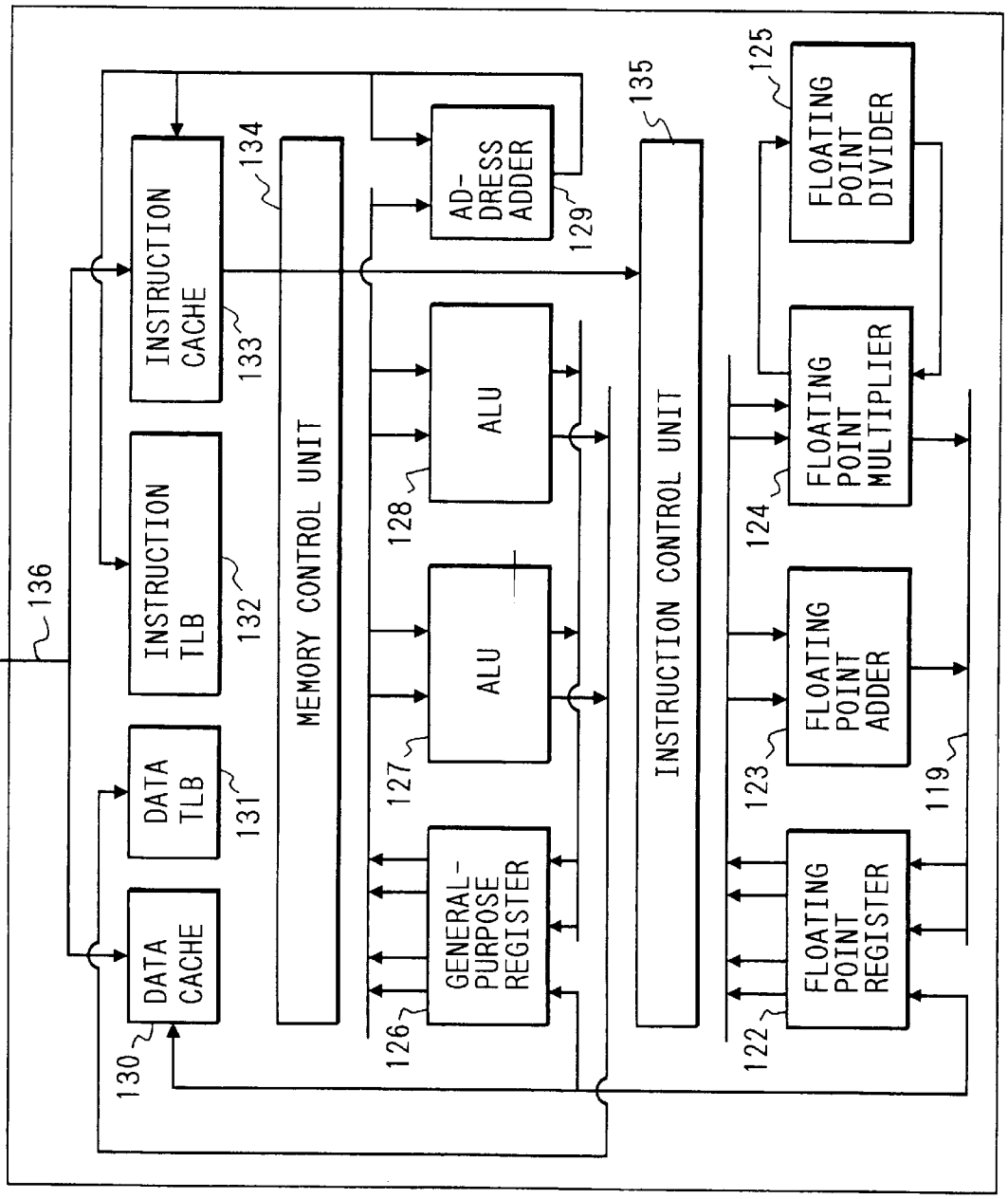
FIG. 3 is a diagram showing an embodiment of a central processing unit of the system shown in FIG. 2.

FIG. 3 shows an example of the internal construction of the central processing unit 119 shown in FIG. 2, which is composed of one chip or a plurality of chips. Internal comprising devices include a floating point register file 122, a floating point adder 123, a floating point multiplier 124, a floating point divider 125, a general-purpose register 126, arithmetic and logic units (ALU) 127 and 128, an address adder 129, a data cache 130, a data TLB 131, an instruction TLB 132, an instruction cache 133 and others. The floating point register 122 and the general-purpose register 126 are connected with the data cache 130, and the address adder 129 and the instruction control unit 135 are connected with the instruction cache 133. The data cache 130 and the instruction cache 133 access data from a plurality of external terminals 136. Floating point calculators 123 to 125 are connected with a first local path or a local path. Integer calculators 127 to 129 are connected with a second local path or a local path. In the central processing unit 119 which is constructed as described above, the logic circuit according to the present invention is used in the internal circuits which forms respective units 122 to 135. Depending on the case, this logic circuit is used in the buffer circuit which connects the units and input/output circuits to be connected with external chip devices.

The logic circuit according to the present invention is applicable to other systems requiring high reliability and high speed operation, in addition to the computer systems.

Figure 1A:
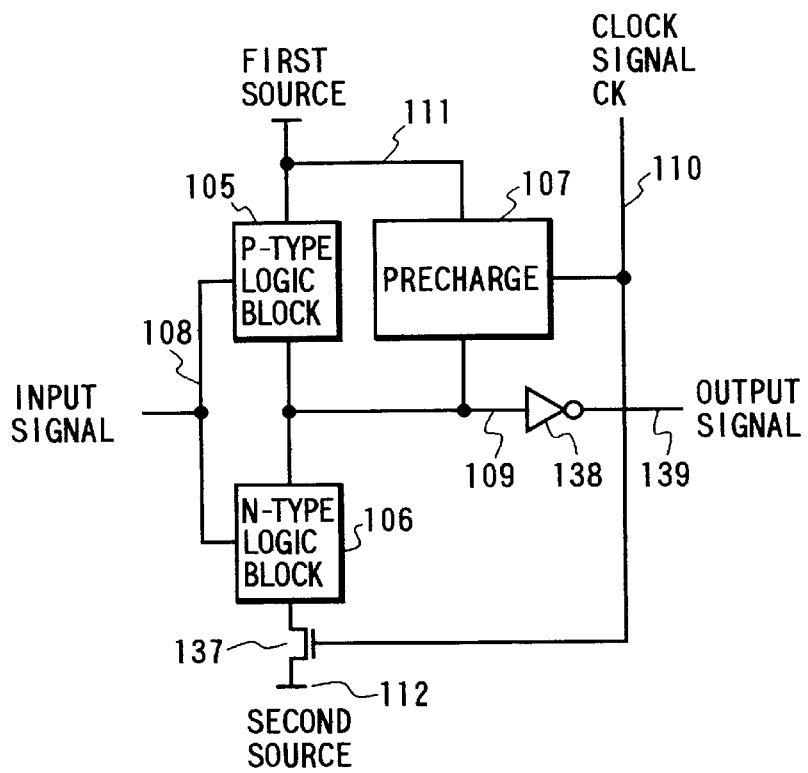
FIGS. 1(*a*)–(*b*) are diagrams showing an example of a circuit to which the present invention applies and operation thereof.
Figure 1B:
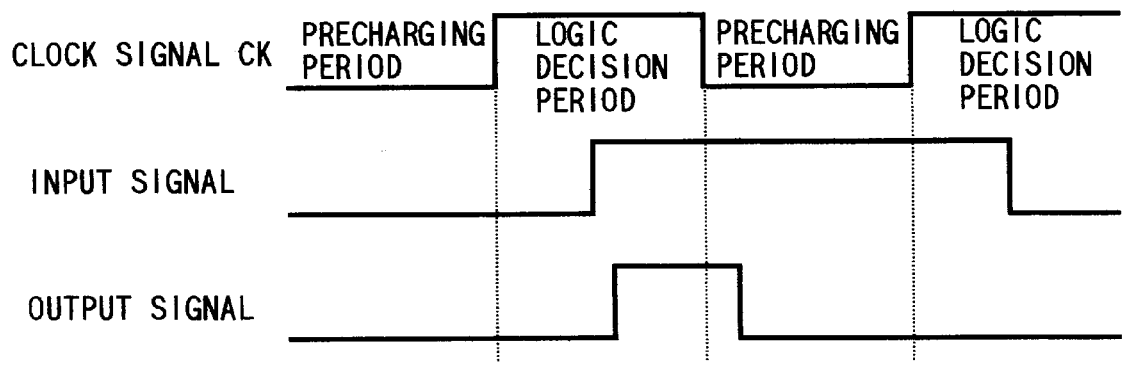
Figure 4:
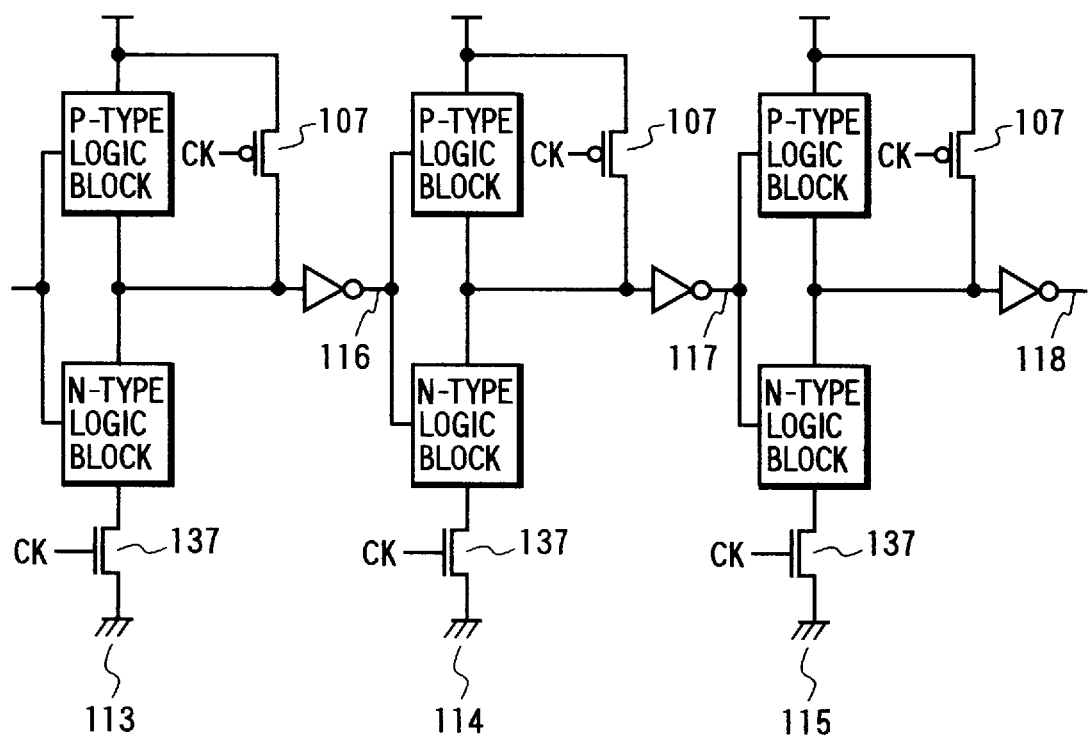
FIG. 4 is a diagram showing an example of a plurality of series-connected circuits to which the present invention applies.

FIG. 4 shows an example of a plurality of series-connected logic circuits according to the present invention shown in FIG. 1. The operation of the circuits in a case that a plurality of logic circuits according to the present invention are series-connected as described above is described below. In this embodiment, the precharging device is formed with the P-type field effect transistor 107. In the precharging period, the clock signal CK is set to a low level, the N-type field effect transistor 137 turns off, the precharging device comprising the P-type field effect transistor 107 turns on and therefore the output terminals 116, 117 and 118 are set to the low level. Accordingly, the N-type logic blocks of the complementary static logic circuits 113, 114 and 115 according to the present invention are turned off.

In the logic determination period, the clock signal CK is set to a high level, the N-type field effect transistor 137 turns on and the precharging device 107 comprising the P-type field effect transistor turns off. In this case, if it is assumed that, for example, the N-type logic block of the complementary static logic circuit 113 according to the present invention is turned on, the output terminal 116 has the high level. If it is assumed that the N-type logic block of the complementary static logic circuit 114 according to the present invention is turned on in accordance with an input signal, the output terminal 117 has the high level. Thus, signals are propagated in sequence as in the domino game. Signals are propagated according to the operation of the N-type logic blocks with a large gain factor $\alpha$ and can therefore provide high speed operation.

Figure 5A:
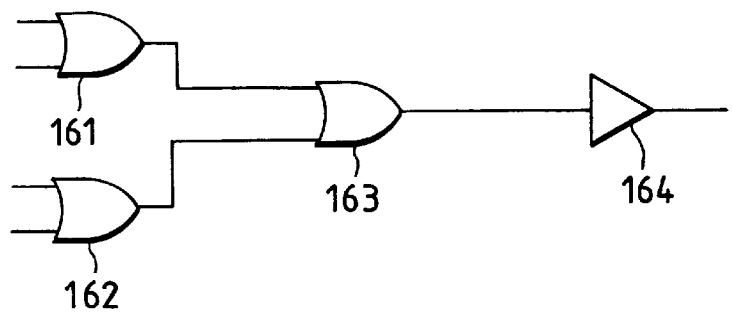
FIGS. 5(*a*)–(*b*) are diagrams showing another example using a plurality of circuits to which the present invention applies.
Figure 5B:
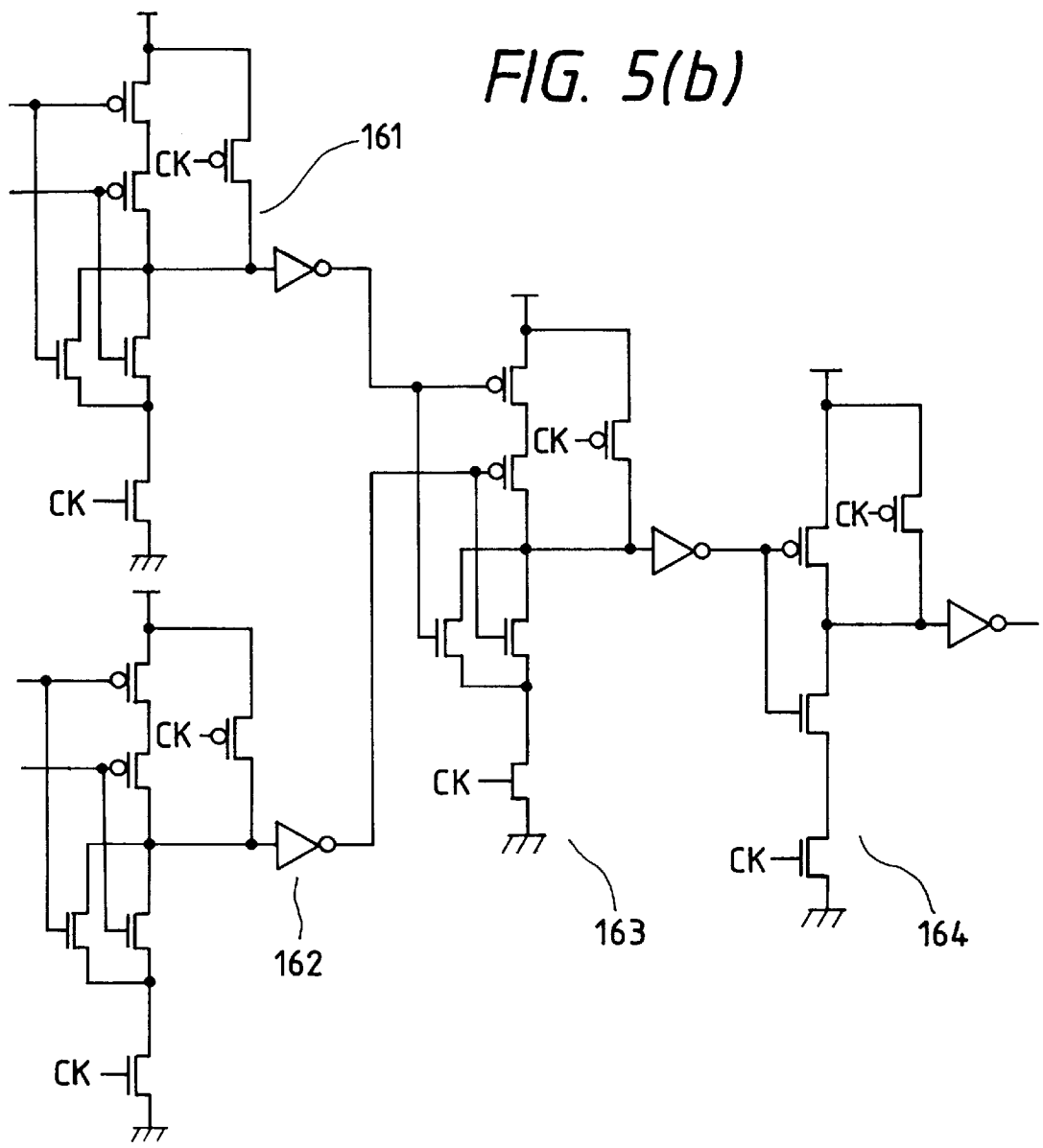

FIG. 5($a$) shows an example of a logic circuit arrangement to which the present invention is applied and FIG. ($b$) shows, in schematic form, the circuit details thereof. OR circuits 161, 162 and 163 shown in FIG. 5($a$) correspond to circuits 161, 162 and 163, respectively, shown in FIG. 5($b$), and a buffer circuit 164 shown in FIG. 5($a$) corresponds to a circuit 164 shown in FIG. 5($b$).

Figure 6A:
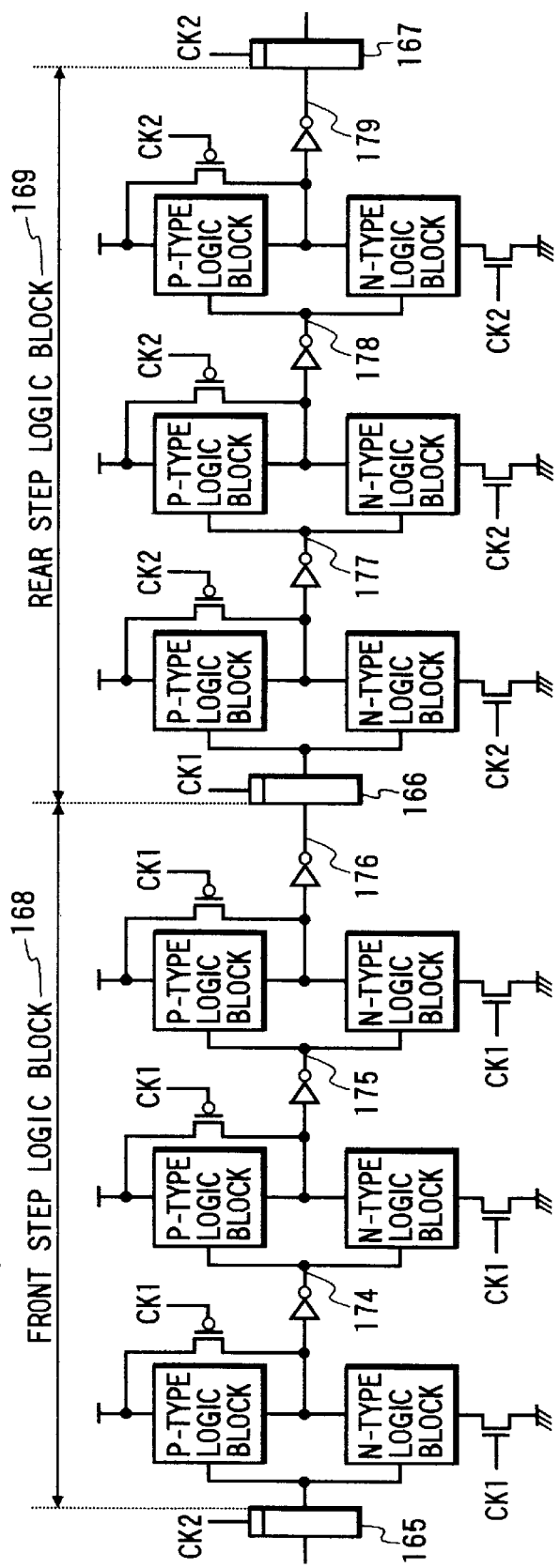
FIGS. 6(*a*)–(*b*) are diagrams showing an embodiment of a static domino type CMOS logic circuit to which the present invention applies.
Figure 6B:
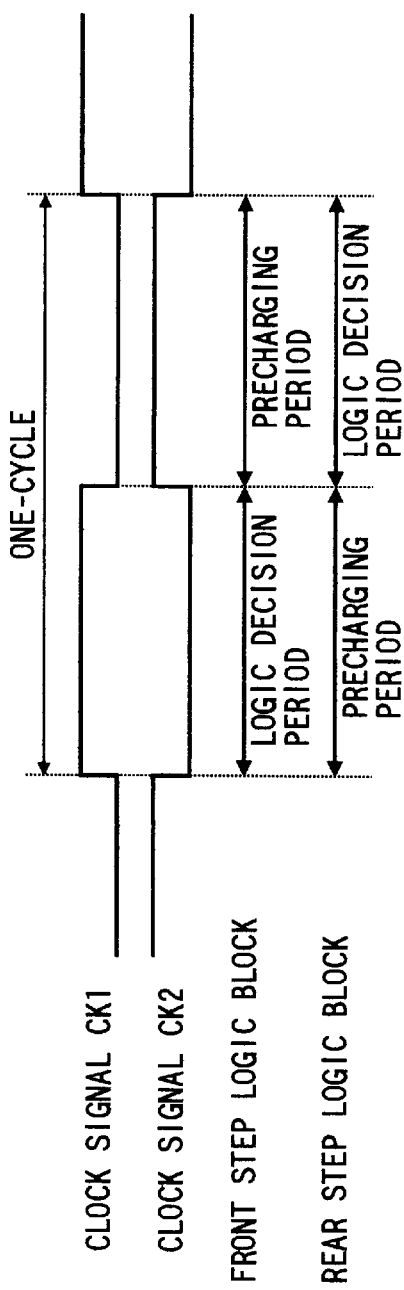

The following describes that, though the complementary static logic circuit according to the present invention cannot execute logic decision during the precharging period, the following configuration, if used, enables continuous logic decision. FIG. 6 shows a configuration example of the complementary static logic circuit according to the present invention which operates in a one cycle of the clock signal. Two-phase clock signals of CK1 and CK2 are used in this embodiment. The logic circuit comprises a logic circuit group 168 of the front step which is composed of the complementary static logic circuits according to the present invention and the logic circuit group 169 of the rear step which is composed of the complementary static logic circuits according to the present invention. Latch circuits 165 and 167 which operate synchronized with the clock signal CK2 are respectively connected to the start point and the end point of a 1-cycle logic block. A latch circuit 166 which operates synchronized with the clock signal CK1 is connected between the logic circuit group 168 of the front step and the logic circuit group 169 of the rear step. The complementary static logic circuit according to the present invention used in the logic circuit group 168 of the front step is connected to the clock signal CK1 and the complementary static logic circuit according to the present invention used in the logic circuit group 169 of the rear step is connected to the clock signal CK2. When the clock signal CK1 remains at the high level and the clock signal CK2 remains at the low level, the logic circuit group 168 of the front step is in the logic decision period while signals are propagated and the logic circuit group 169 of the rear step is in the precharging period, and all output terminals of the rear step logic block attain the low level. On the other hand, when the clock signal CK1 remains at the low level and the clock signal CK2 remains at the high level, the logic circuit group 168 of the front step is in the precharging period and all output terminals attain the low level, and the logic circuit group 169 of the rear step is in the logic decision period while signals are propagated. Thus, continuous logic decision for one cycle can be executed by dividing the 1-cycle logic block into the front step and the rear step and alternately repeating the precharging operation and the logic decision for each half cycle.

Figure 7A:
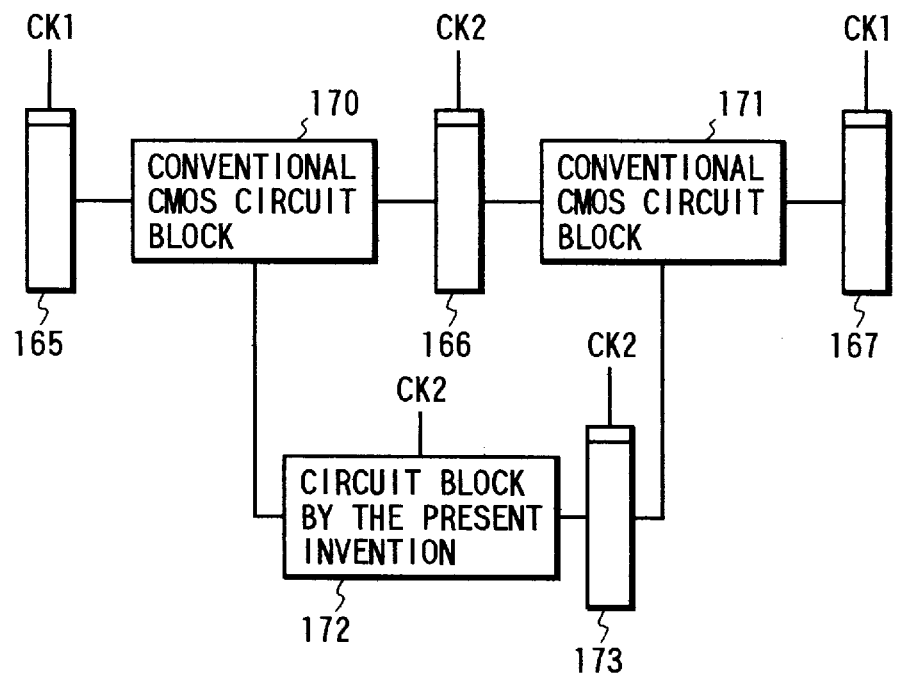
FIGS. 7(*a*)–(*b*) are diagrams showing a configuration example of a logic block which operates in one clock cycle and to which the present invention applies.
Figure 7B:
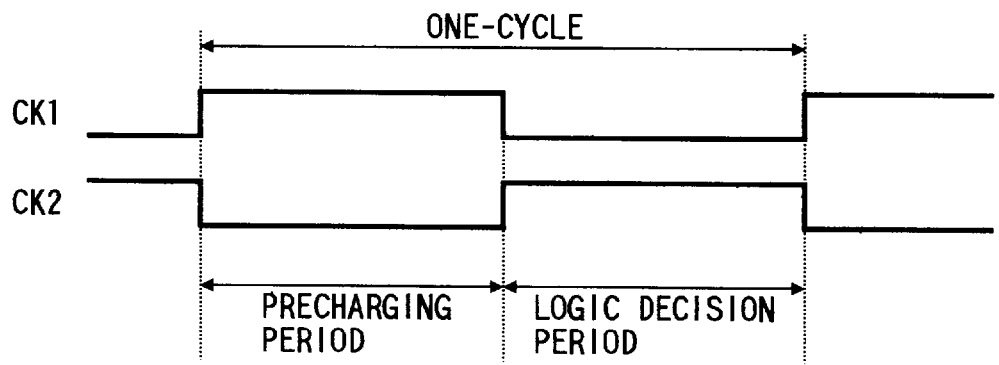

The following describes an embodiment which mixingly comprises the complementary static logic circuit according to the present invention and the conventional CMOS circuit having no precharge means. FIG. 7 shows a configuration diagram of the logic block which operates in one clock cycle. The front step comprises a logic block 170 formed by the conventional complementary CMOS circuit having no precharge means and the rear step comprises a logic block 171 formed by the conventional CMOS circuit having no precharge means. The latch circuits 165 and 167 to be connected to the clock signal CK1 are respectively connected to the start point and the end point. The latch circuit 166 to be connected to the clock signal CK2 is connected between the logic block 170 of the front step and the logic block 171 of the rear step. A logic block 172 comprising a complementary static logic circuit according to the present invention is connected between the logic block 170 of the front step and the logic block 171 of the rear step. A latch circuit 173 is connected between the logic block 172 and the logic block 171 and the logic block 172 and the latch circuit 173 are connected to the clock signal CK2. In such configuration as described above, when the clock signal CR1 is at the high level and the clock signal CK2 is at the low level, the logic block 172 performs precharging and, when the clock signal CK1 is at the low level and the clock signal CK2 is at the high level, the logic block 172 executes logic decision. On the path from the logic block 170 of the front step to the logic block 172, the input signals of the logic block 172 need be defined within a period while the clock signal CK2 remains at the low level and, on the path from the logic block 172 to the logic block 171, the input signals of the latch circuit 173 need be defined within a period while the clock signal CK2 remains at the high level.

Figure 8A:
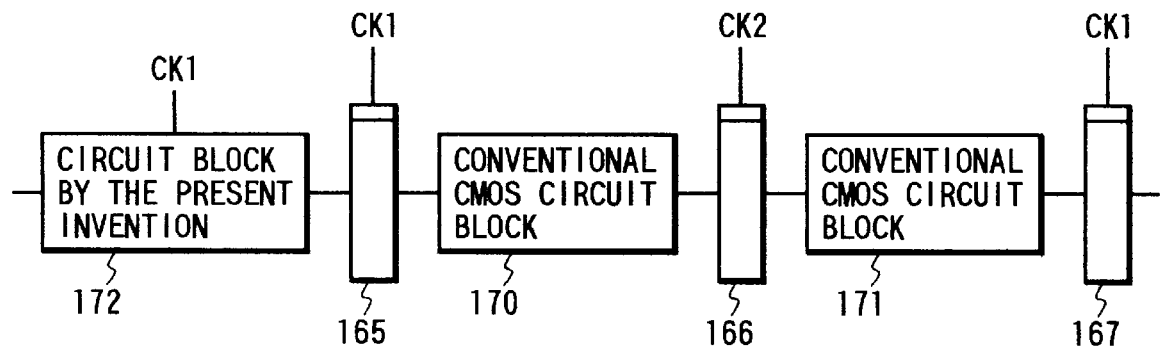
FIGS. 8(*a*)–(*b*) are another configuration example of a logic block which operates in one clock cycle and to which the present invention applies.
Figure 8B:
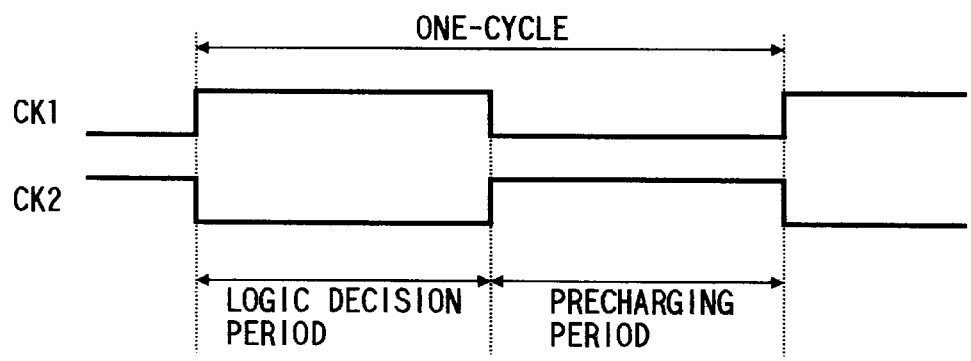
Figure 9:
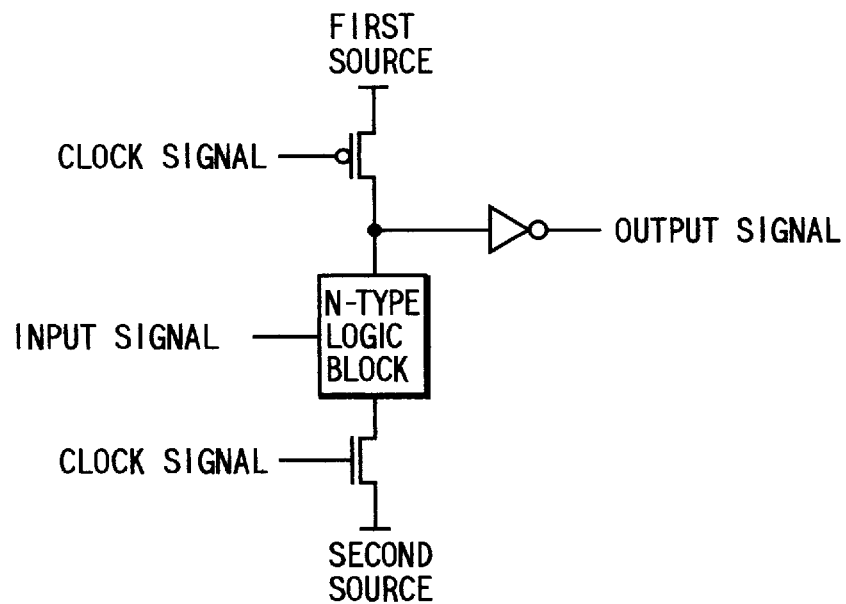
FIG. 9 is a diagram showing a conventional CMOS domino circuit.
Figure 12:
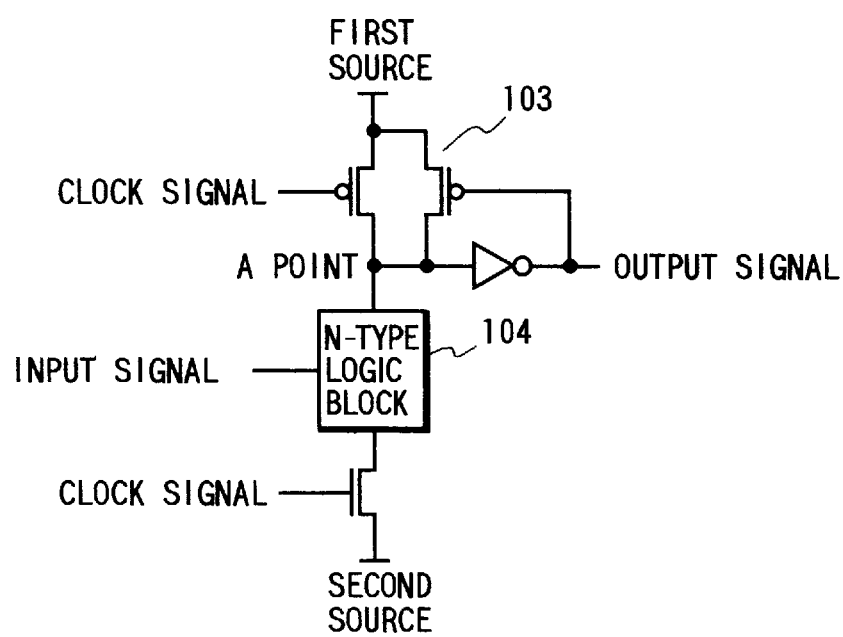
FIG. 12 is a diagram showing another example of the conventional circuit.
Figure 10A:
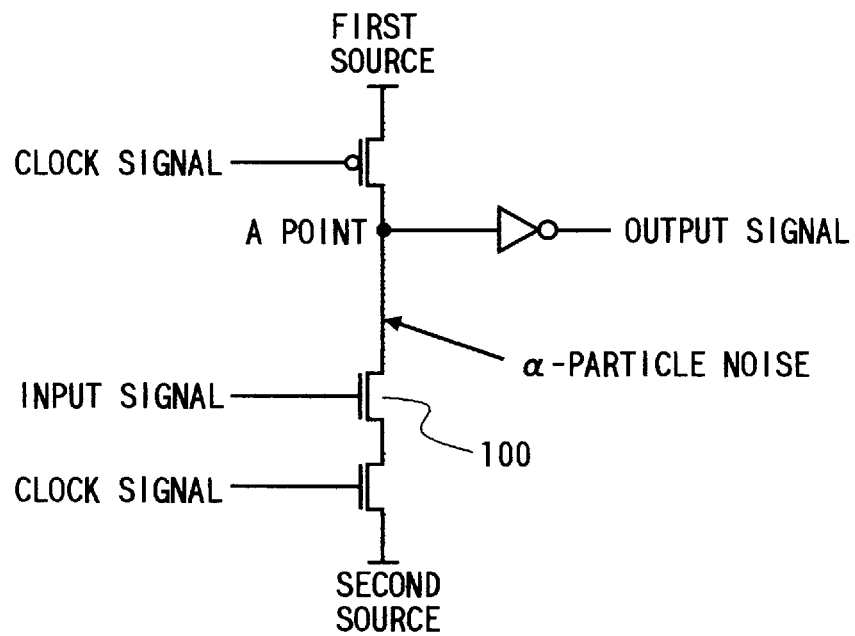
FIGS. 10(*a*)–(*b*) are diagrams showing a problem of the circuit shown in FIG. 9.
Figure 10B:
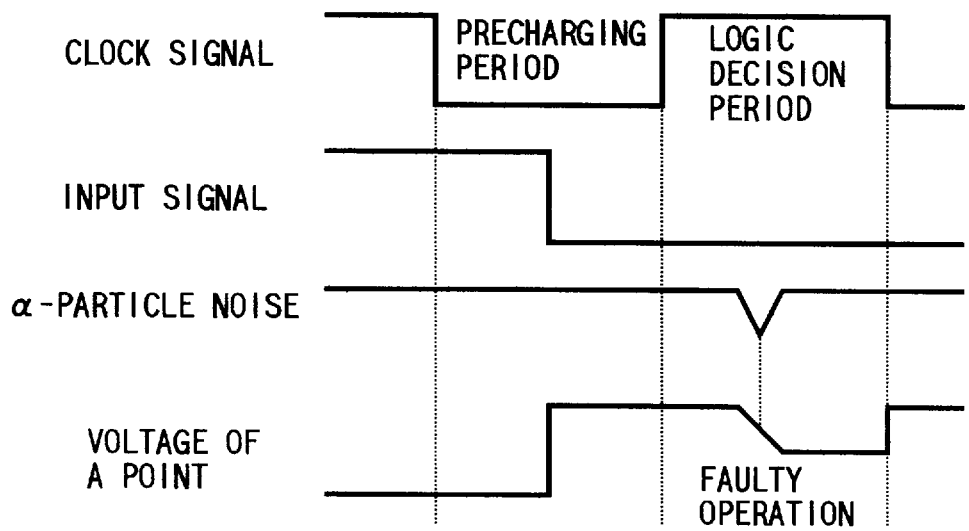
Figure 11A:
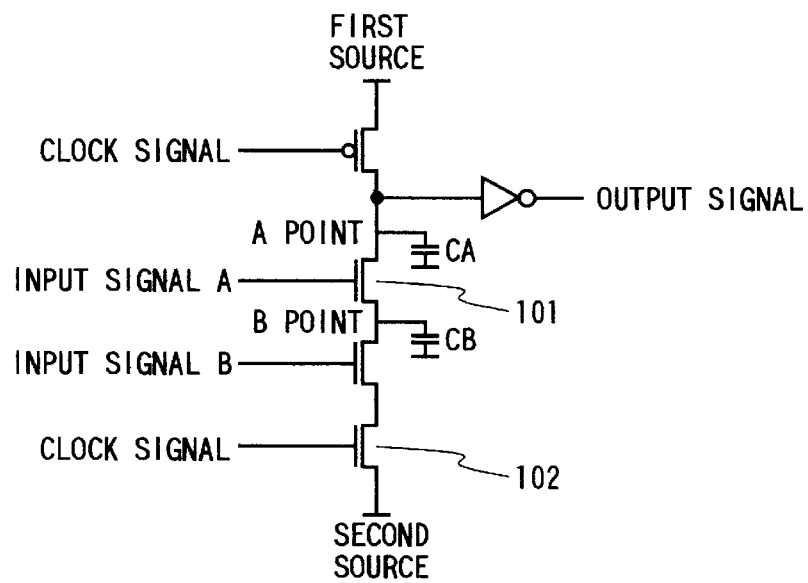
FIGS. 11(*a*)–(*b*) are diagrams showing another problem of the conventional CMOS domino circuit.
Figure 11B:
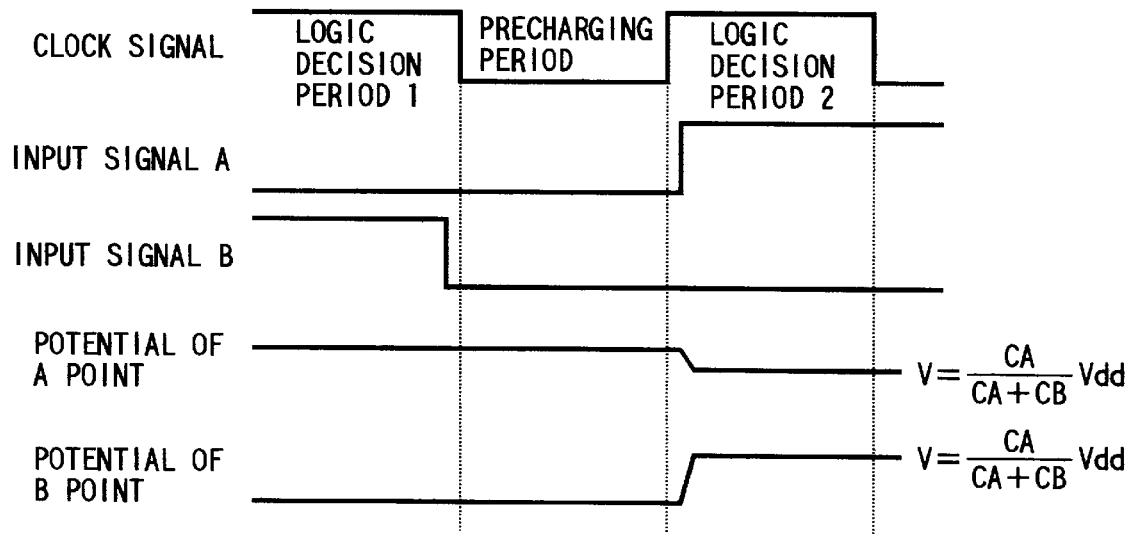

FIG. 8 shows another embodiment in which the complementary static logic circuit according to the present invention and the conventional complementary CMOS circuit having no precharge means are mixingly provided. FIG. 8 shows a configuration diagram of the logic block which operates in one clock cycle. The logic block of the front step comprises the logic block 172 formed with the complementary static logic circuit according to the present invention and the logic block 170 formed with the conventional complementary CMOS circuit having no precharge means, and the logic block of the rear step comprises the logic block 171 formed with the conventional complementary CMOS circuit having no precharge means. The latch circuit 165 is connected between the logic block 172 and the logic block 170 of the front step, and the logic block 172 and the latch circuit 165 are connected to the clock signal CK1. The latch circuit 166 is connected between the logic block 170 and the logic block 171, and the latch circuit 167 is connected to the end point of the 1-cycle logic. The latch circuit 166 is connected to the clock signal CK2 and the latch circuit 167 is connected to the clock signal CK1. In such configuration as described above, when the clock signal CK1 is at the high level and the clock signal CK2 is at the low level, the logic block 172 executes logic decision and, when the clock signal CK1 is at the low level and the clock signal CK2 is at the high level, the logic block 172 executes precharging operation. Input signals of the logic block 172 need be defined within a period while the clock signal CK1 remains at the low level and the input signals of the latch circuit 166 need be defined within a period while the clock signal CK1 remains at the high level.

Figure 13:
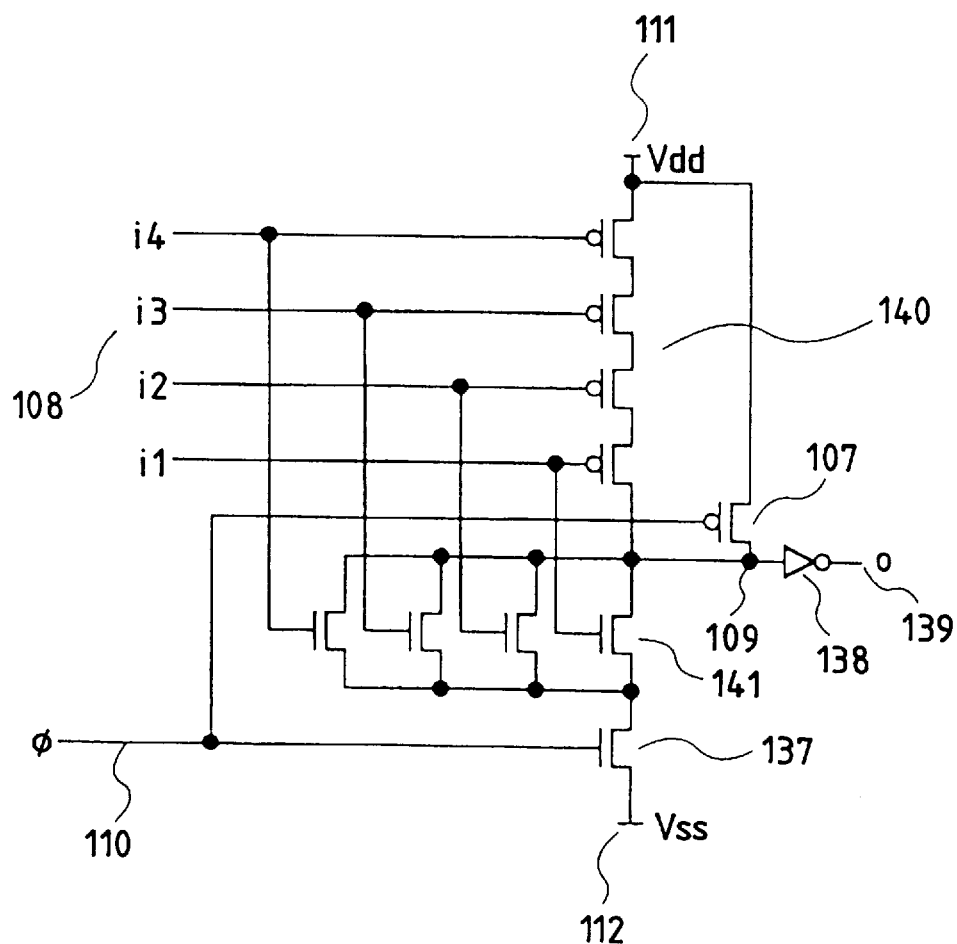
FIG. 13 is a diagram showing an example of a 4OR circuit to which the present invention applies.

FIG. 13 shows an embodiment of the 4OR circuit comprising the complementary static logic circuit according to the present invention. The following describes the circuit configuration referring to the corresponding relationship of parts shown in FIGS. 1 and 13. The P-type logic block 105 shown in FIG. 1 corresponds to P-type field effect transistors 140 which are series-connected in four layers shown in FIG. 13. The N-type logic block 106 shown in FIG. 1 corresponds to N-type field effect transistors 141 which are parallel-connected in four layers shown in FIG. 13. The N-type field effect transistor 137 shown in FIG. 1 corresponds to the N-type field effect transistor 137 shown in FIG. 13 and the precharging device 107 shown in FIG. 1 corresponds to the P-type field effect transistor 107 shown in FIG. 13, respectively. 108 are input terminals and 139 is an output terminal. Since the P-type field effect transistors are series-connected in four layers in the 4OR circuit, the switching speed is largely affected due to a low gain factor $\beta$ of the P-type field effect transistors and a starting delay time of the internal terminal 109 is large. Accordingly, the effect of high speed operation of the complementary static logic circuit according to the present invention remarkably appears on the OR system circuit in which P-type field effect transistors are series-connected in a plurality of layers as in the 4OR circuit.

Figure 14:
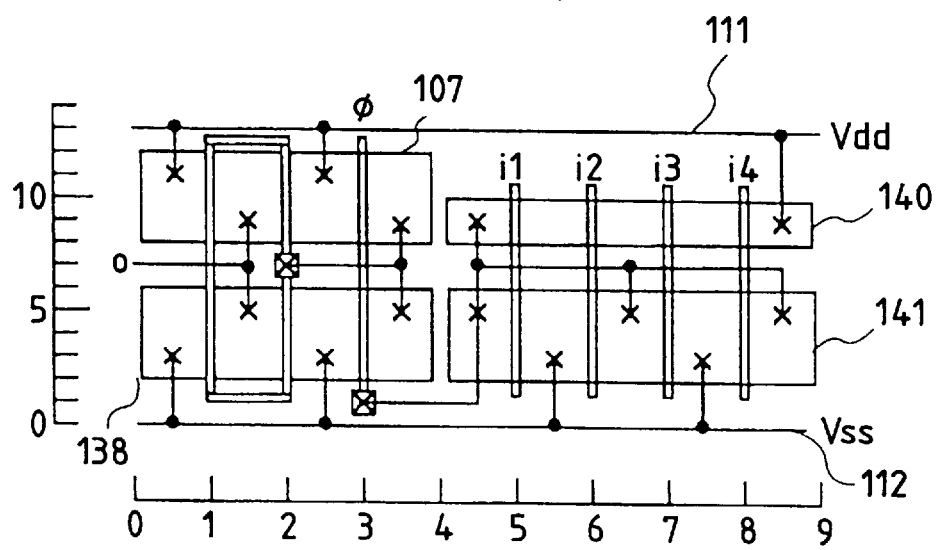
FIG. 14 is a diagram showing a layout example of the circuit shown in FIG. 13.
Figure 15:
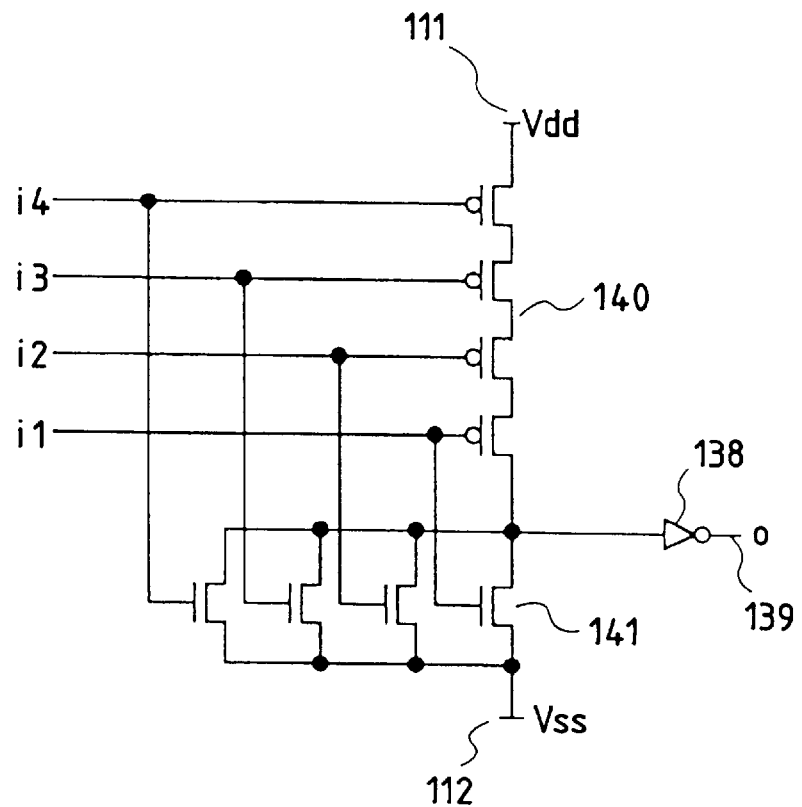
FIG. 15 is a diagram showing an example of the conventional 4OR circuit.
Figure 16:
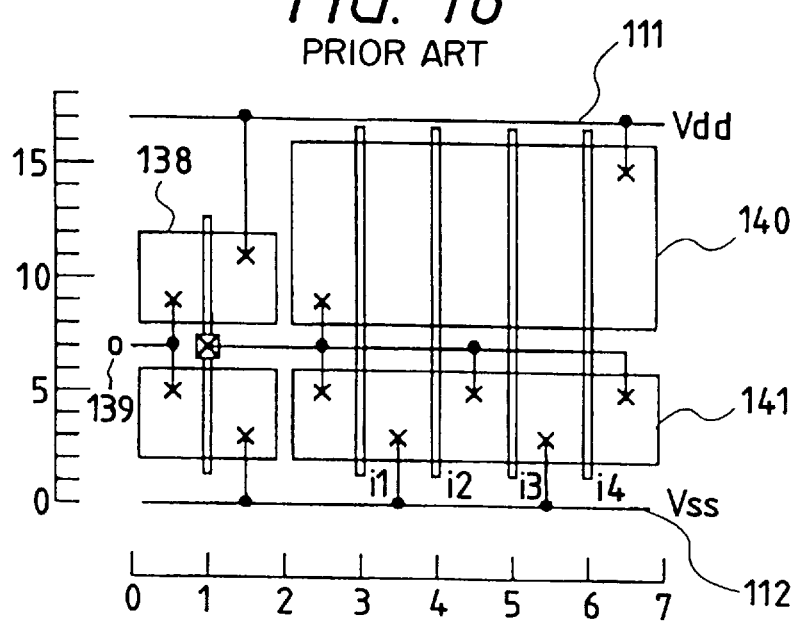
FIG. 16 is a diagram showing a layout example of the circuit shown in FIG. 15.

The layout of the 4OR circuit shown in FIG. 13 is shown in FIG. 14. Reference numerals which indicate the components of the circuit diagram shown in FIG. 13 are the same as those of corresponding components shown in FIG. 14. The scales of the vertical axis and the horizontal axis are shown as layout pitches. In FIG. 14, though the unit pitch length on the vertical axis is different from that on the horizontal axis for convenience in viewing the diagram, these unit pitches are actually equal in length. In this layout, nine pitches are plotted on the horizontal axis and fourteen pitches are plotted on the vertical axis, and an area of a cell is 126 square pitch. FIG. 15 shows a example of the same logic as the 4OR circuit comprising the complementary static logic circuit according to the present invention shown in FIG. 13 formed by using the conventional complementary CMOS circuit having no precharge means and FIG. 16 shows the layout thereof. In this layout, seven pitches are plotted on the horizontal axis and eighteen pitches are plotted on the vertical axis, and the area of the cell is 126 square pitch. The layout area of the 4OR circuit comprising the complementary static logic circuit according to the present invention shown in FIG. 13 is equal to that of the conventional complementary CMOS circuit having no precharge means despite that the former circuit has two more transistors than the latter circuit. This means that, in the complementary static logic circuit according to the present invention, high speed operation is implemented by designing the channel width of the P-type field effect transistors to be sufficiently small and therefore an increase in the horizontal direction due to an increase of the number of transistors is offset by reducing the length in the vertical direction.

Figure 17:
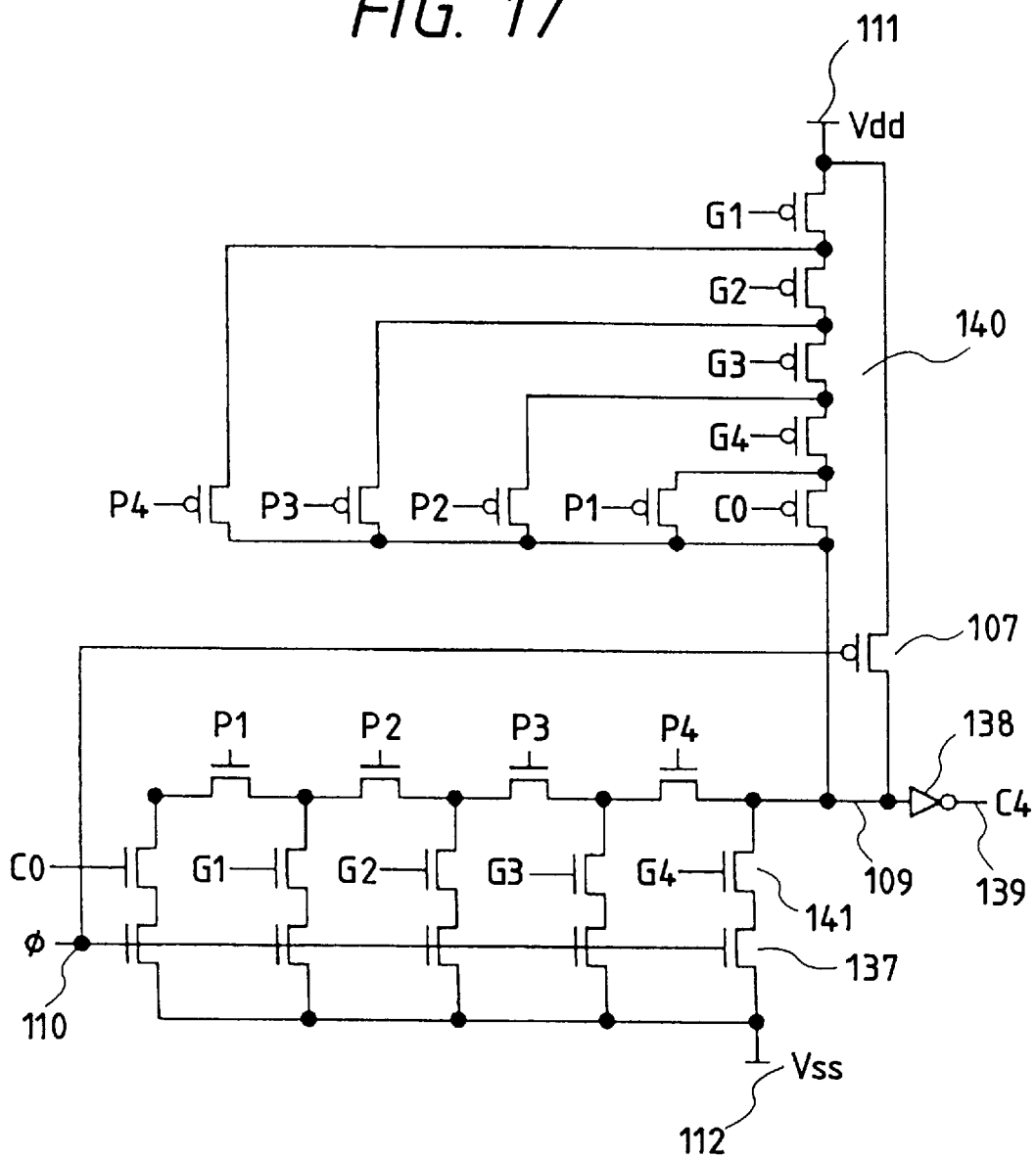
FIG. 17 is a diagram showing an embodiment of a 4-bit adder to which the present invention applies.

FIG. 17 shows an embodiment of a 4-bit adder comprising the complementary static logic circuits according to the present invention. In FIG. 17, 140 is a P-type logic block, 141 is an N-type logic block, 107 is a P-type field effect transistor for precharging, 137 is an N-type field effect transistor which prevents a through current during precharging, 110 is a precharging signal input terminal, and 139 is an output terminal. Logical meanings of input signal and output signal are denoted as shown below as disclosed in "Neil H. E. Weste and Kamran Eshraghian; Principles of CMOS VLSI Design".

The carry of the ith stage Ci is expressed by an equation given below.

$$C_i = G_i + P_i \times C_{i-1}$$

where, $G_i = A_i \times B_i$ (generated signal)

$P_i = A_i + B_i$ (propagated signal)

In case of four bits, the terms of the following equations can be obtained.

$$C_1 = G_1 + P_1 C_0$$

$$C_2 = G_2 + P_2 G_1 + P_2 P_1 C_0$$

$$C_3 = G_3 + P_3 G_2 + P_3 P_2 G_1 + P_3 P_2 P_1 C_0$$

$$C_4 = G_4 + P_4 G_3 + P_4 P_3 G_2 + P_4 P_3 P_2 G_1 + P_4 P_3 P_2 P_1 C_0$$

Term $C_4$ can be expressed as given by the following equation.

$$C_4 = G_4 + P_4(G_3 + P_3(G_2 + P_2(G_1 + P_1 C_0)))$$

FIG. 17 shows a circuit representation of this function. This function circuit comprises the P-type logic block 140, the N-type logic block 141 and the output inverter 138. If the 4-bit adder of this embodiment is formed with the conventional complementary CMOS circuit having no precharge means, P-type field effect transistors are series-connected in five layers from the first power supply terminal 111 to the internal terminal 109. Accordingly, the starting delay time of the internal terminal 109 is extremely large. The 4-bit adder comprising the complementary static logic circuit according to the present invention does not cause a problem that the starting delay time of the internal terminal 109 is large as in the conventional complementary CMOS circuit having no precharge means since the voltage of the internal terminal 109 is boosted in advance by precharging and therefore high speed operation can be obtained.

Figure 18:
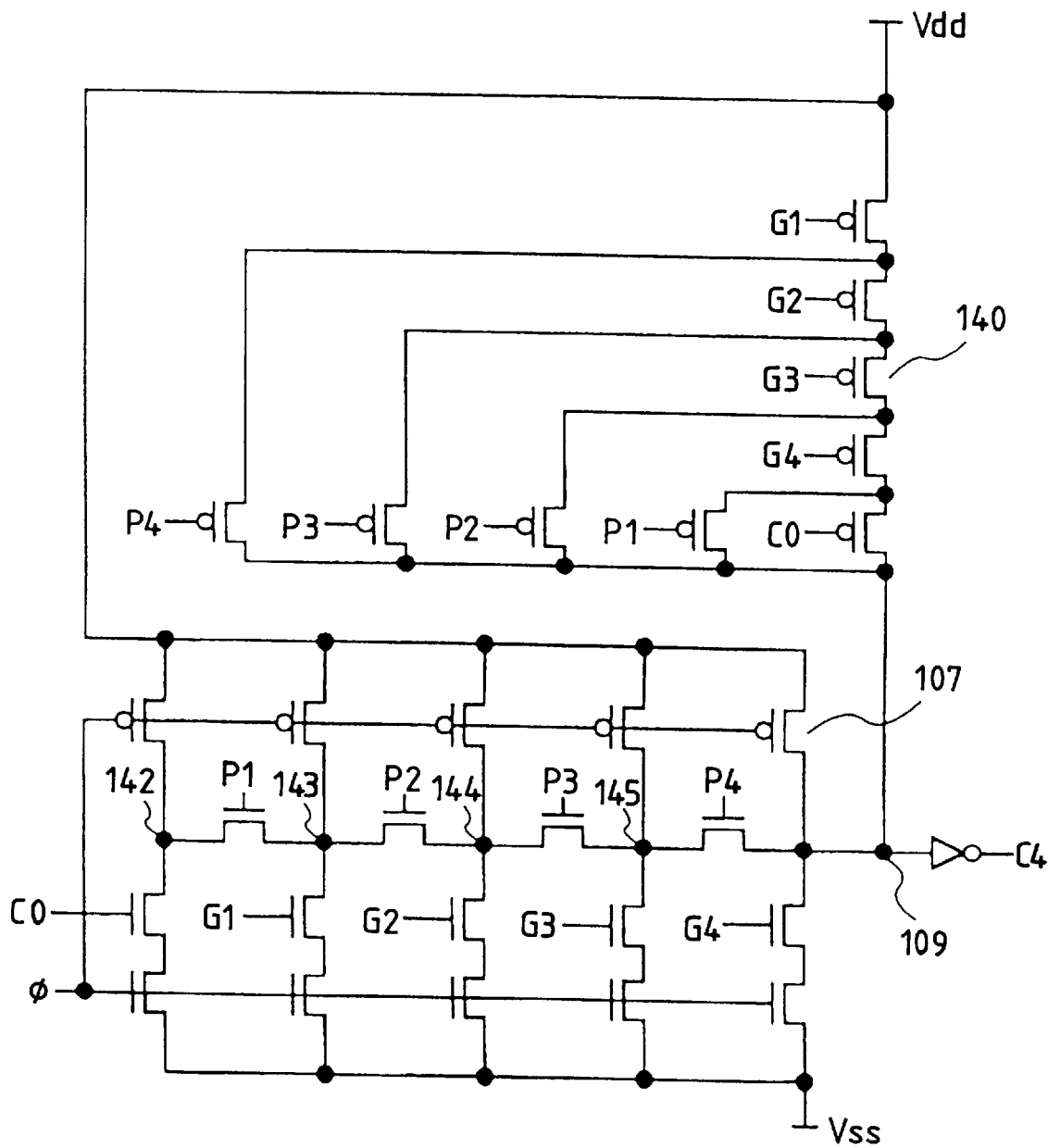
FIG. 18 is a diagram showing another example of a 4-bit adder to which the present invention applies.

The basic circuit configuration of the embodiment shown in FIG. 18 is the same as that of the embodiment shown in FIG. 17. In the embodiment shown in FIG. 18, the nodes 142 to 145 and 109 of the N-type field effect transistors which form the N-type logic block are precharged respectively by the P-type field effect transistors to quicken the precharging time and simultaneously reduce an effect on the circuit performance due to charge redistribution.

Figure 19:
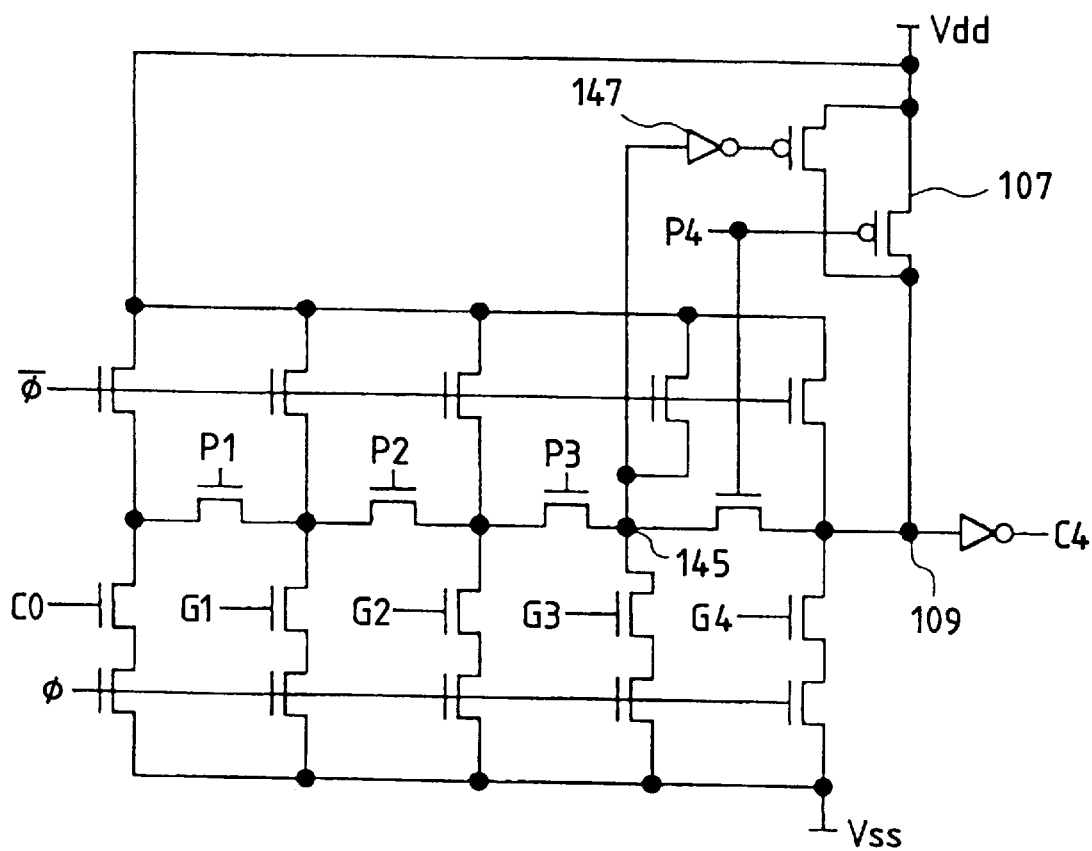
FIG. 19 is a diagram showing a further another example of a 4-bit adder to which the present invention applies.

FIG. 19 shows the circuit configuration of the embodiment shown in FIG. 18 in which the number of transistors is reduced. Though the P-type logic block is formed with a completely complementary logic in the embodiment shown in FIG. 18, the number of P-type field effect transistors of the P-type logic block in this embodiment is reduced to 33% by using logic signals of the node 145 and the input signal P4.

Figure 20:
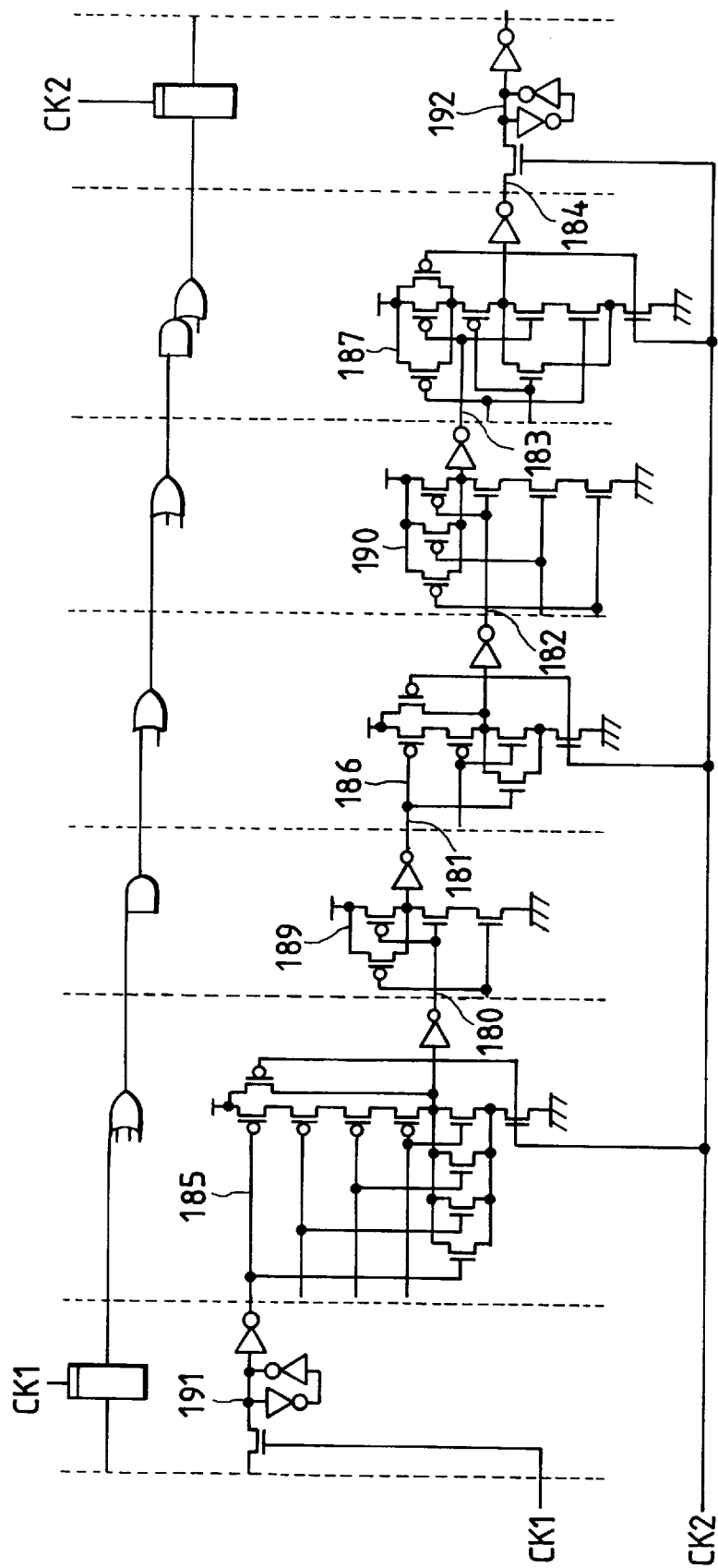
FIG. 20 is a diagram showing an example of a complementary static logic circuit to which the present invention applies provided with a conventional complementary static logic circuit.

FIG. 20 shows an example of a logic block which comprises complementary static logic circuits 185, 186 and 187 which are respectively provided with a voltage setting device according to the present invention, conventional complementary static logic circuits 189 and 190 having no voltage setting device, and latch circuits 191 and 192. The latch circuit 191 at the input side is connected to the clock signal CK1. The latch circuit 192 at the output side and the complementary static logic circuits 185, 186 and 187 having the voltage setting device according to the present invention are connected to the clock signal CK2. The complementary static logic circuits having the voltage setting device according to the present invention are connected to the output of the latch circuit 191 at the input side. The logic block of this embodiment does not include the inversion logic circuit. In such configuration as described above, while the clock signal CK2 remains at the low level, the output terminal 180 of the complementary static logic circuit 185 having the voltage setting device according to the present invention is set to the low level voltage. Since the input terminal 180 of the conventional complementary static logic circuit 189 having no voltage setting device has a low level voltage, the output terminal 181 thereof is also set to the low level voltage. Similarly, all output terminals 180, 181, 182, 183, and 184 are set to the low level voltage. A period when all output terminals are set to the low level voltage during the period when the clock signal CK2 is at the low level as described above is the precharging period. In the precharging period, the clock signal CK1 has the high level, and the latch circuit 191 allows to pass the input data to the output, thereby defining the input data signal of the complementary static logic circuit 185 having the voltage setting device according to the present invention. If the input data signal of the complementary static logic circuit 185 is a signal of a high level voltage, the NMOS transistor of the complementary static logic circuit 185 turns on and the output terminal 180 rises at a high level voltage when the clock signal CK2 rises at the high level. If the other terminal of the complementary static logic circuit 185 has the high level, the NMOS transistor of the complementary static logic circuit 189 turns on and the output terminal 181 rises at the high level voltage. Thus, data is propagated in sequence. On the contrary, if all input data signals of the complementary static logic circuit 185 are low level voltage signals, the PMOS transistor of the complementary static logic circuit 185 turns on and the output terminal 180 remains unchanged at the low level. The input of the complementary static logic circuit 189 remains at the low level and the output terminal 181 remains unchanged with the low level voltage. Thus, in all circuits, signals are propagated only when the NMOS transistors turn on and, when the PMOS transistors turn on, the output remains unchanged with the precharged voltage. Accordingly, the propagation delay time of signals of the logic block shown in this embodiment is determined when the NMOS transistors turn on. Though the output inverter of each circuit turn on the PMOS transistors, only the PMOS transistors of one layer are always turned on. Signals are always propagated only by the NMOS transistors having a large gain factor and therefore high speed operating function is obtained. As described above, it is known that, even though the complementary static logic circuit having the voltage setting device according to the present invention and the conventional complementary static logic circuit having no voltage setting device are provided simultaneously, such configuration as the output is set in advance at the low level voltage and the signals are propagated only when the NMOS transistor turn on is enabled.

Figure 21:
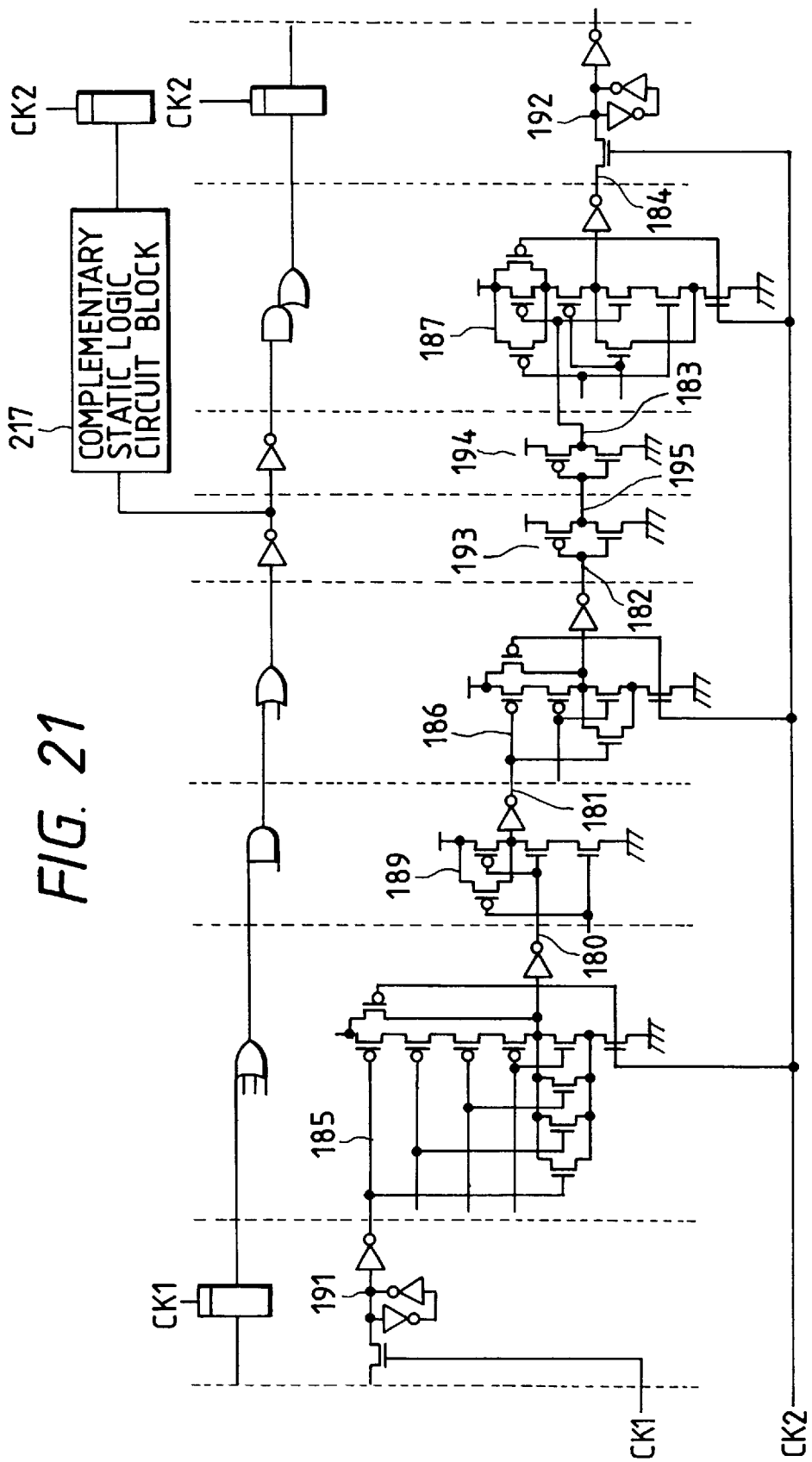
FIG. 21 is a diagram showing another example of a complementary static logic circuit to which the present invention applies provided with a conventional complementary static logic circuit.
Figure 22:
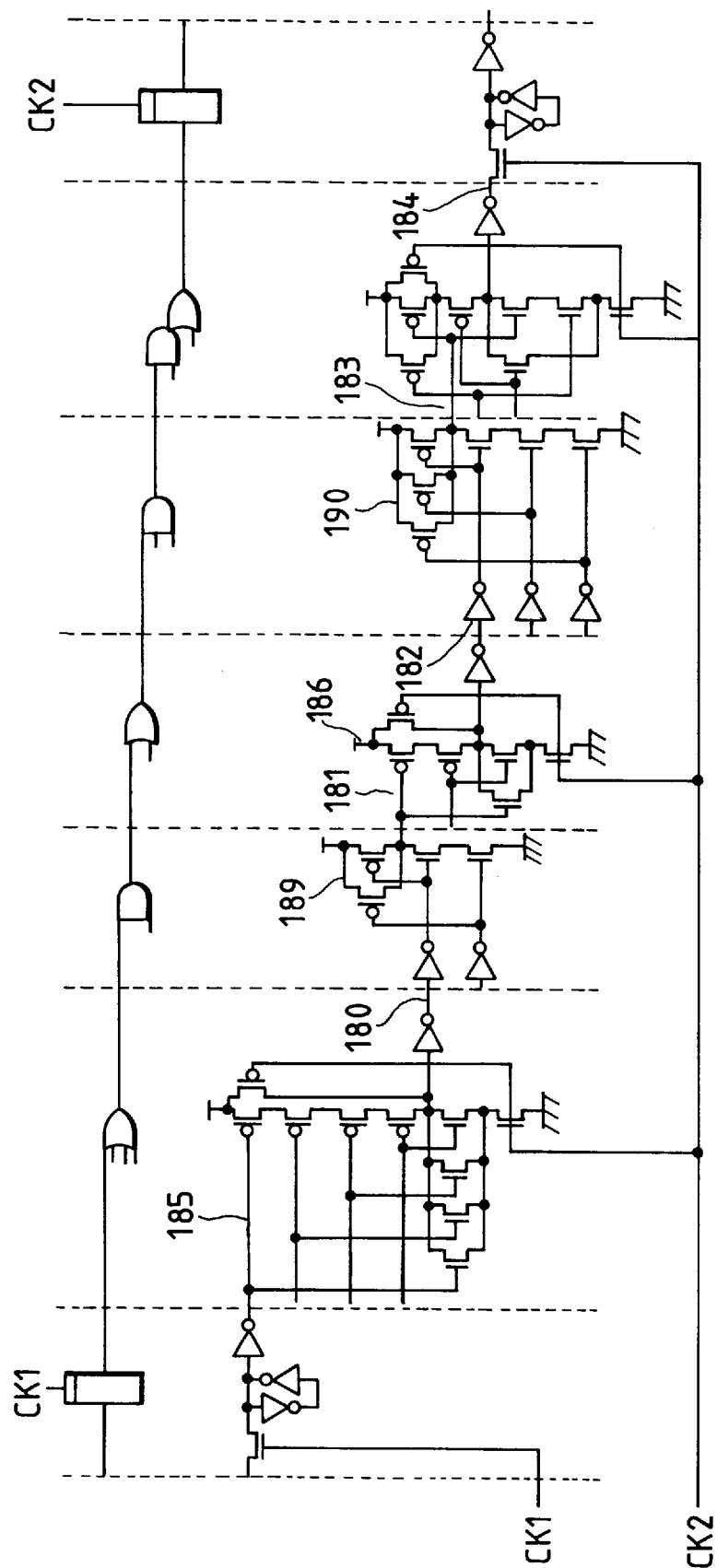
FIG. 22 is a diagram showing a further another example of a complementary static logic circuit to which the present invention applies provided with a conventional complementary static logic circuit.
Figure 23:
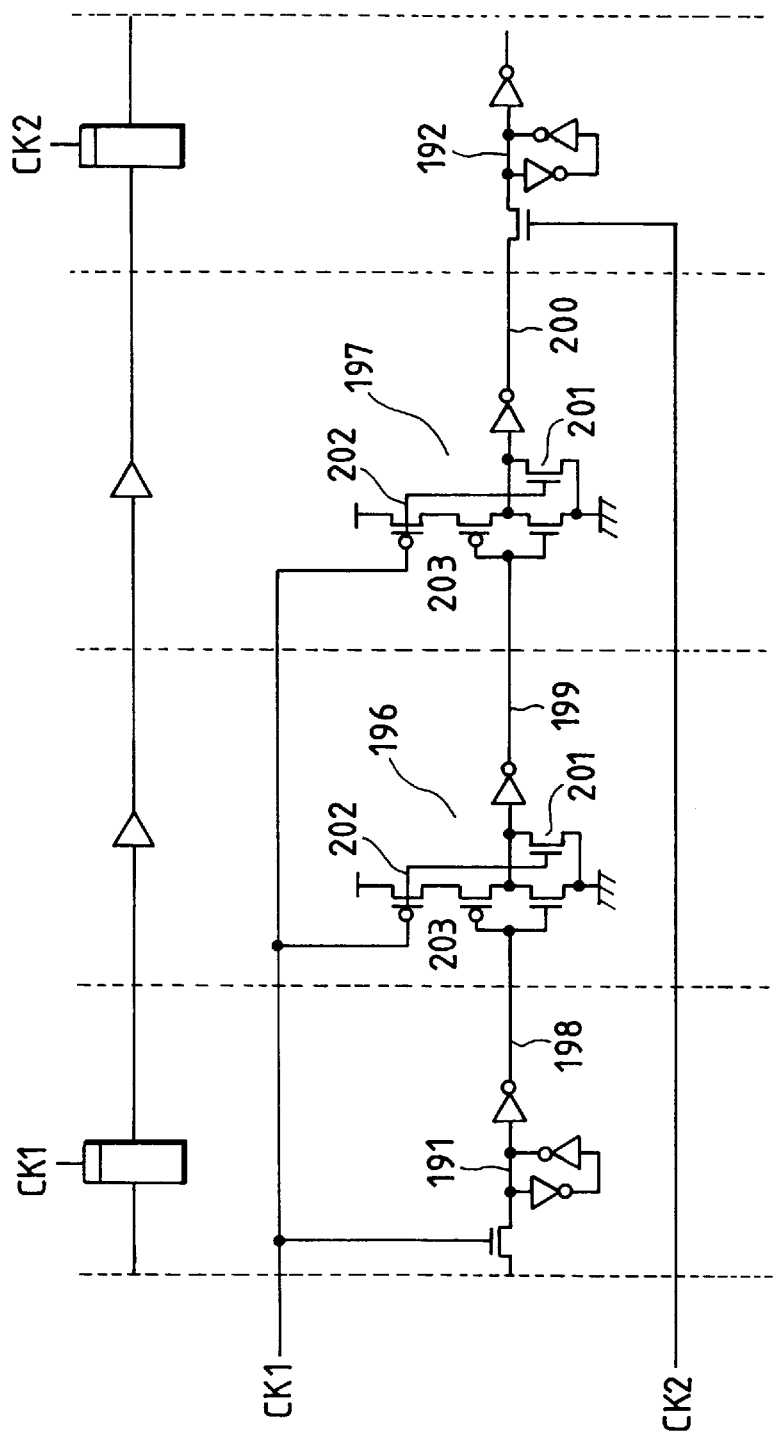
FIG. 23 is a diagram showing an example of a buffer circuit to which the present invention applies.
Figure 24A:
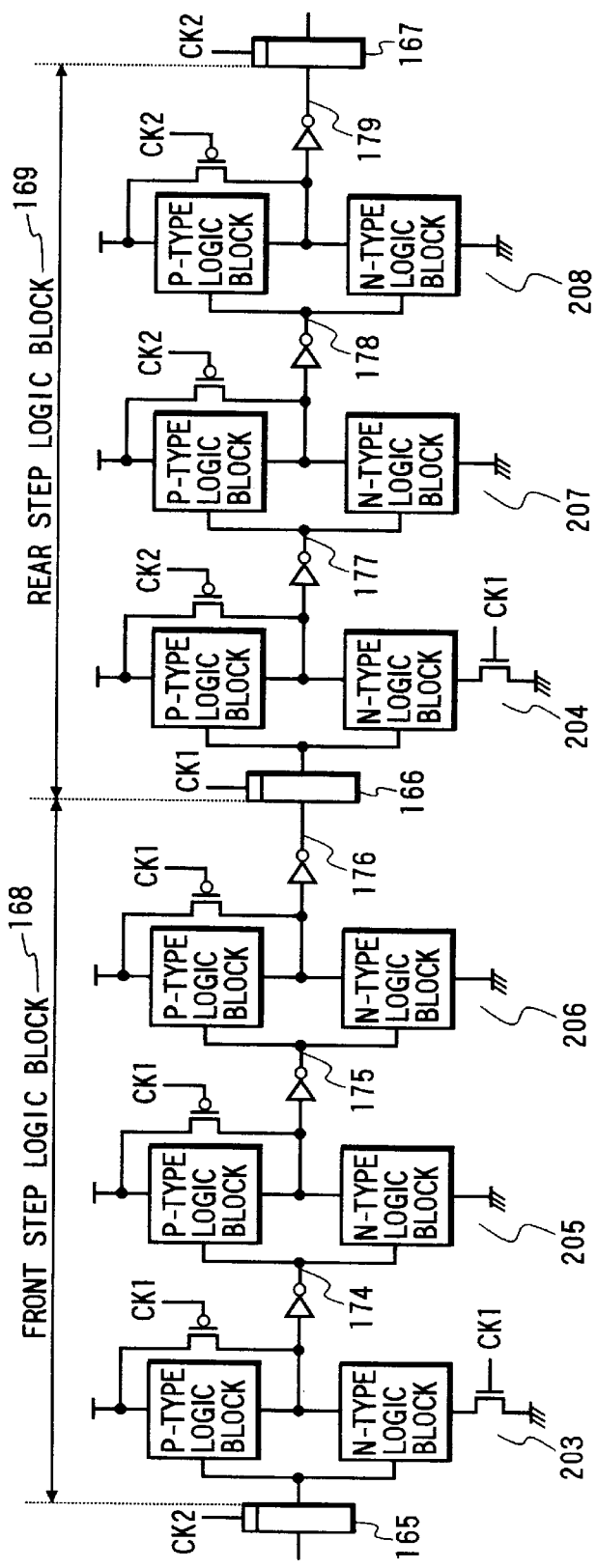
FIGS. 24(*a*)–(*b*) are diagrams showing an example of a series connection of a plurality of complementary static logic circuits operation therefor to which the present invention applies.
Figure 24B:
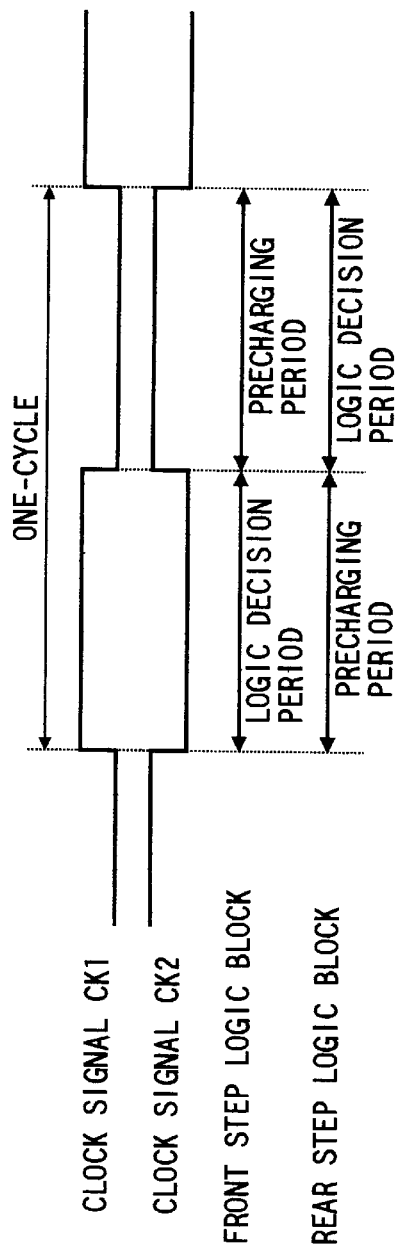
Figure 25A:
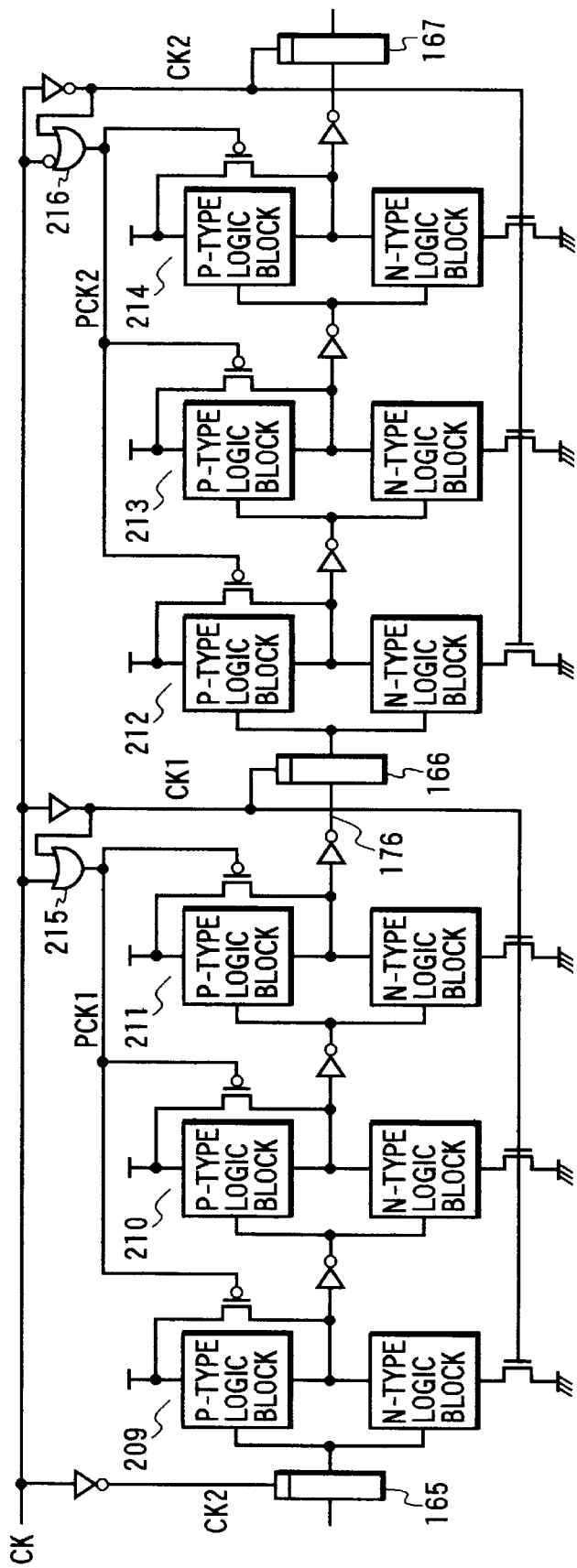
FIGS. 25(*a*)–(*b*) are diagrams showing another connection example of a plurality of complementary static logic circuits and operation therefor to which the present invention applies.
Figure 25B:
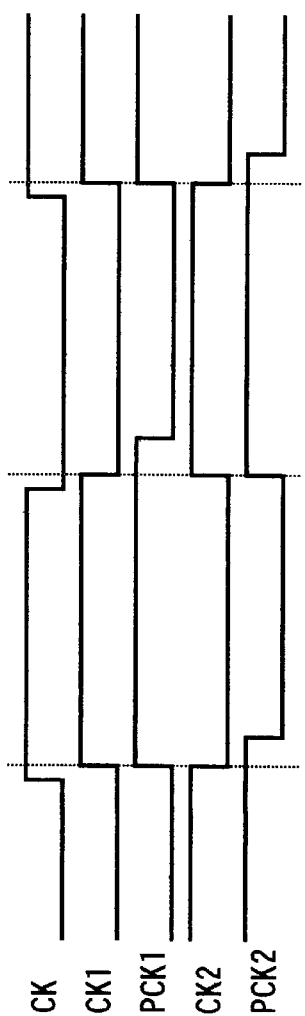

FIG. 21 shows an example of the logic block which comprises complementary static logic circuits 185, 186 and 187 each having the voltage setting device according to the present invention, conventional complementary static logic circuits 189, 193 and 194 each having no voltage setting device, and latch circuits 191 and 192. The latch circuit 191 at the input side is connected to the clock signal CK1. The latch circuit 192 at the output side and the complementary static logic circuits 185, 186 and 187 each having the voltage setting device according to the present invention are connected to the clock signal CK2. The complementary static logic circuits each having the voltage setting device according to the present invention are connected to the output of the latch circuit 191 at the input side. The logic block includes the inversion logic circuits 193 and 194. The output terminal of the inversion logic circuit 193 is connected to the other complementary static logic circuit block 217. The complementary static logic circuit block 217 comprises the conventional complementary static logic circuits each having no voltage setting device.

In such configuration as described above, when the clock signal CK2 remains at the low level, the output terminal 180 of the complementary static logic circuits 185 each having the voltage setting device according to the present invention is set to the low level voltage. The input terminal 180 of the conventional complementary static logic circuit 189 having no voltage setting device has the low level voltage and therefore the output terminal 181 thereof is also set to the low level voltage. Similarly, output terminals 182, 183 and 184 are set at the low level voltage but the output terminal 195 is set at the high level voltage.

As described above, if terminals are provided which are set at the high level voltage during the precharging period in the logic circuit block which includes the complementary static logic circuits each having the voltage setting device according to the present invention, the terminals are always inverted to the low level voltage by the inversion logic circuit. According to this embodiment, the signals of the terminal 195 are inverted by the inverter circuit 194 and entered into the complementary static logic circuit 187 each having the voltage setting device according to the present invention. In such a configuration, the input terminals of all other logic circuits except the inversion logic circuit are set at the low level voltage.

A period while all input terminals except the inversion logic circuit are thus set at the low level voltage when the clock signal CK2 remains at the low level refers to the precharging period. In the precharging period, the clock signal CK1 has the high level, and the latch circuit 191 allows passing the input data to the output, thereby defining the input data signal of the complementary static logic circuit 185 having the voltage setting device according to the present invention. If the input data signal of the complementary static logic circuit 185 is a signal of a high level voltage, the NMOS transistor of the complementary static logic circuit 185 turns on and the output terminal 180 rises at a high level voltage when the clock signal CK2 rises at the high level. If the other terminals of the complementary static logic circuit 189 have the high level, the NMOS transistor of the complementary static logic circuit 189 turns on and the output terminal 181 rises at the high level voltage. Thus, data is propagated in sequence.

The output terminal 195 of the inversion logic circuit falls from the high level voltage to the low level voltage. However, the input terminal of the complementary static logic circuit 187 having the voltage setting device according to the present invention rises from the low level voltage to the high level voltage and the signals are continuously propagated. On the contrary, if it is assumed that all input data signals of the complementary static logic circuit 185 are low level voltage signals, the PMOS transistors of the complementary static logic circuit 185 turn on and the output terminal 180 remains unchanged at the low level. The input terminal of the complementary static logic circuit 189 remains at the low level and the output terminal 181 also remains unchanged at the low level voltage. The output terminal 195 of the inversion logic circuit 193 remains unchanged at the high level voltage while the input terminal of the complementary static logic circuit 187 having the voltage setting device according to the present invention remains unchanged at the low level. Thus, the signals are propagated through all circuits except the inversion logic circuit only when the NMOS transistors turn on, and the output terminals remain unchanged with the precharged voltage when the PMOS transistors turn on.

Accordingly, the propagation delay time of the signals of the logic blocks shown in this embodiment is determined when the NMOS transistors except the inversion logic circuit turn on. Since signal propagation is always carried out only by the NMOS transistors having a large gain factor, high speed operating functions can be obtained. Thus it is known that, even though the complementary static logic circuit having the voltage setting device according to the present invention, the conventional complementary static logic circuit having no voltage setting device, and the inversion logic circuit are provided simultaneously, such a configuration as the output is set in advance at the low level voltage and the signals are propagated only when the NMOS transistor turn on is enabled.

As described above, the present invention provides a semiconductor integrated circuit apparatus capable of implementing high speed propagation of signals. In addition, the present invention enables to materializing a semiconductor integrated circuit apparatus provided with high noise tolerance or high noise immunity.

What is claimed is:

1. A semiconductor integrated circuit apparatus comprising a completely complementary static CMOS circuit comprised of a plurality of complementary MOS transistor blocks each having a first block of MOS transistors of a first conductivity type which is connected to a first source and output parts and which receives input signals, and a second block of MOS transistors of a second conductivity type which is connected to said output parts and a second source and which receives said input signals, wherein the number of MOS transistors of the first conductivity type in the first block is equal to the number of MOS transistors of the second conductivity type in the second block, and wherein:

said plurality of complementary MOS transistor blocks are connected in series and the output signals of a first one of said series-connected complementary MOS transistor blocks are entered as input signals for a second one of said series-connected complementary MOS transistor blocks;

a potential setting circuit which sets the output signals of each of said series-connected complementary MOS transistor blocks to a potential of said second source in synchronization with a common clock signal is provided at each occurrence between adjacently disposed complementary MOS transistor blocks in said plurality of complementary MOS transistor blocks; and signals are propagated from the first one of said series-connected complementary MOS transistor blocks to the second one of said series-connected complementary MOS transistor blocks by operation of said second block of MOS transistors in said first one of said series-connected complementary MOS transistor blocks.

2. A semiconductor integrated circuit apparatus according to claim 1, wherein said potential setting circuit comprises a precharge circuit which is connected to said first source and sets the output parts of said complementary MOS transistor blocks to a potential of said first source in synchronization with a clock signal and an inverter which sets said output parts to be set to the potential of the first source by the precharge means to a potential of said second source.

3. A semiconductor integrated circuit apparatus according to claim 2, wherein said precharge circuit is provided with a PMOS transistor which forms a source/drain current path between said first source and the output parts of said complementary MOS transistor blocks.

4. A semiconductor integrated circuit apparatus according to claim 1, wherein the first block is a PMOS transistor block and the second block is an NMOS transistor block, and wherein there is provided a timing control circuit which is connected between said NMOS transistor block and said second source and controls operating timing of said NMOS transistor block in synchronization with said clock signal.

5. A semiconductor integrated circuit apparatus according to claim 4, wherein said timing control circuit is provided with an NMOS transistor which forms a source/drain current path between said NMOS transistor block and said second source.

6. A semiconductor integrated circuit apparatus according to claim 4, wherein said NMOS transistor block has a plurality of NMOS transistors which are connected in parallel between said output parts and the drain of the NMOS transistor of said timing control circuit.

7. A semiconductor integrated circuit apparatus according to claim 6, wherein said PMOS transistor block has a plurality of PMOS transistors which are connected in series between said first source and said output parts.

8. A semiconductor integrated circuit apparatus according to claim 1, wherein the first block is a PMOS transistor block and the second block is an NMOS transistor block in each of said plurality of complementary MOS transistor blocks, and wherein there is provided a timing control circuit in the first one of said series-connected complementary MOS transistor blocks which is connected between said NMOS transistor block thereof and said second source and controls operating timing of that NMOS transistor block in synchronization with said clock signal.

9. A semiconductor integrated circuit apparatus according to claim 8, wherein said timing control circuit includes an NMOS transistor which forms a source/drain current path between said NMOS transistor block and said second source.

10. A semiconductor integrated circuit apparatus according to claim 8, wherein each said NMOS transistor block has a plurality of NMOS transistors which are connected in parallel between said output parts and the drain of the NMOS transistor of said timing control circuit.

11. A semiconductor integrated circuit apparatus according to claim 10, wherein each said PMOS transistor block has a plurality of PMOS transistors which are connected in series between said first source and said output parts.

12. A semiconductor integrated circuit apparatus according to claim 11, wherein said timing control circuit includes an NMOS transistor which forms a source/drain current path between said NMOS transistor block and said second source.

13. A semiconductor integrated circuit apparatus according to claim 12, wherein said potential setting circuit comprises precharge circuits each of which is connected to said first source and sets the output parts of respective ones of said complementary MOS transistor blocks to a potential of said first source in synchronization with a precharge portion of said clock signal and an inverter which sets said output parts to be set to the potential of the first source by the precharge means to a potential of said second source.

14. A semiconductor integrated circuit apparatus according to claim 13, wherein said precharge circuits each include a PMOS transistor and form a source/drain current path between said first source and the output parts of said complementary MOS transistor blocks, respectively.

15. A semiconductor integrated circuit apparatus according to claim 8, wherein said potential setting circuit comprises precharge circuits each of which is connected to said first source and sets the output parts of respective ones of said complementary MOS transistor blocks to a potential of said first source in synchronization with a precharge portion of said clock signal and an inverter which sets said output parts to be set to the potential of the first source by the precharge means to a potential of said second source.

16. A semiconductor integrated circuit apparatus according to claim 15, wherein said precharge circuits each include a PMOS transistor and form a source/drain current path between said first source and the output parts of said complementary MOS transistor blocks, respectively.

17. A semiconductor integrated circuit apparatus which has a plurality of logic blocks each substantially comprising MOS transistors, wherein:
at least one of said plurality of logic blocks has a completely complementary static CMOS circuit comprised of a plurality of complementary MOS transistor blocks each having a first block of MOS transistors of a first conductivity type which is connected to a first source and output parts and which receives input signals, and a second block of MOS transistors of a second conductivity type which is connected to said output parts and a second source and which receives said input signals, wherein the number of MOS transistors of the first conductivity type in the first block is equal to the number of MOS transistors of the second conductivity type in the second block;
said plurality of complementary MOS transistor blocks are connected in series so that the output signals of a first one of said series-connected complementary MOS transistor blocks are entered as input signals for a second one of said series-connected complementary MOS transistor blocks;
a potential setting circuit for setting the output signals of each of said series-connected complementary MOS transistor blocks to the potential of said second source in synchronization with a common clock signal is provided at each occurrence between adjacently disposed complementary MOS transistor blocks in said plurality of complementary MOS transistor blocks; and
signals are propagated from the first one of said series-connected complementary MOS transistor blocks to the second one of said series-connected complementary MOS transistor blocks by operation of said second block of MOS transistors in said first one of said series-connected complementary MOS transistor blocks.

18. A semiconductor integrated circuit apparatus according to claim 17, wherein a latch circuit which operates synchronized with a clock signal to be entered into the potential setting means of the first one of said series-connected complementary MOS transistor blocks is provided between said logic blocks.

19. A semiconductor integrated circuit apparatus according to claim 18, wherein said clock signal to be entered into the first one of said series-connected complementary MOS transistor blocks is an inverted signal of the clock signal to be entered into the second one of said series-connected complementary MOS transistor blocks.

20. A semiconductor integrated circuit apparatus according to claim 17, wherein said potential setting circuit comprises a precharge circuit which is connected to said first source and sets the output parts of said complementary MOS transistor blocks to a potential of said first source in synchronization with said clock signal and an inverter which sets said output parts to be set to the potential of said first source by the precharge means to a potential of said second source.

21. A semiconductor integrated circuit apparatus according to claim 20, wherein said precharge circuit is provided with a PMOS transistor which forms a source/drain current path between said first source and the output parts of said complementary static logic blocks.

22. A semiconductor integrated circuit apparatus according to claim 20, wherein the first block is a PMOS transistor block and the second block is an NMOS transistor block, and wherein there is provided a timing control circuit which is connected between said NMOS transistor block and said second source and controls operating timing of said NMOS transistor block in synchronization with said clock signal.

23. A semiconductor integrated circuit apparatus according to claim 22, wherein said timing control circuit is provided with an NMOS transistor which forms a source/drain current path between said NMOS transistor block and said second source.

24. A semiconductor integrated circuit apparatus according to claim 20, wherein the first block is a PMOS transistor block and the second block is an NMOS transistor block in each of said plurality of complementary MOS transistor blocks, and wherein there is provided a timing control circuit which is connected between said NMOS transistor block and said second source in the first one of said series-connected complementary MOS transistor blocks of each of said at least one of said plurality of logic blocks such that operating timings of all NMOS transistor blocks in each of said at least one of said plurality of logic blocks are in synchronization with a non-precharge portion of said clock signal of that logic block, a precharge portion of said clock signal being associated with the setting of the potential of the output signals of said series-connected complementary MOS transistor blocks of a respective logic block to said second source by said potential setting circuit.

25. A semiconductor integrated circuit apparatus according to claim 24, wherein each said precharge circuit of a logic block includes a PMOS transistor which forms a source/drain current path between said first source and the output parts of corresponding ones of said complementary static logic blocks and which switches to an ON state during a precharge operation of that logic block, the precharge operations of adjacently disposed logic blocks occur during different time intervals of a same clock signal.

26. A semiconductor integrated circuit apparatus comprising a completely complementary CMOS circuit comprised of a plurality of complementary MOS transistor blocks each having a first block of MOS transistors of a first conductivity type which is connected to a first source and output parts and which receives input signals, and a second block of MOS transistors of a second conductivity type which is connected to said output parts and a second source and which receives said input signals, and wherein:

said plurality of complementary MOS transistor blocks are connected in series and the output signals of each preceding one of said series-connected complementary MOS transistor blocks are entered as input signals for respectively successive ones of said series-connected complementary MOS transistor blocks;

a potential setting circuit which simultaneously sets the output signals of all of said series-connected complementary MOS transistor blocks to a potential of said second source in synchronization with a common clock signal is provided at each occurrence between adjacently disposed complementary MOS transistor blocks in said plurality of complementary MOS transistor blocks; and signals are propagated from a first one of said series-connected complementary MOS transistor blocks to the second and successive ones of said series-connected complementary MOS-transistor blocks through operation of only the second blocks of MOS transistors beginning with said second block of MOS transistors in said first one of said series-connected complementary MOS transistor blocks.

27. A semiconductor integrated circuit apparatus according to claim 26, wherein the first block is a PMOS transistor block and the second block is an NMOS transistor block in each of said plurality of complementary MOS transistor blocks, and wherein there is provided a timing control circuit in at least the first one of said series-connected complementary MOS transistor blocks which is connected between said NMOS transistor block thereof and said second source and controls operating timing of that NMOS transistor block in synchronization with said clock signal.

28. A semiconductor integrated circuit apparatus according to claim 27, wherein each said NMOS transistor block has a plurality of NMOS transistors which are connected in parallel between said output parts and the drain of the NMOS transistor of said timing control circuit.

29. A semiconductor integrated circuit apparatus according to claim 28, wherein each said PMOS transistor block has a plurality of PMOS transistors which are connected in series between said first source and said output parts.

30. A semiconductor integrated circuit apparatus according to claim 29, wherein said timing control circuit includes an NMOS transistor which forms a source/drain current path between said NMOS transistor block and said second source.

31. A semiconductor integrated circuit apparatus according to claim 27, wherein said timing control circuit includes an NMOS transistor which forms a source/drain current path between said NMOS transistor block and said second source.

32. A semiconductor integrated circuit apparatus according to claim 31, wherein said potential setting circuit comprises precharge circuits each of which is connected to said first source and sets the output parts of a respective one of said complementary MOS transistor blocks to a potential of said first source in synchronization with a precharge portion of said clock signal and an inverter which sets said output parts to be set to the potential of the first source by the precharge means to a potential of said second source.

33. A semiconductor integrated circuit apparatus according to claim 32, wherein each said precharge circuit includes a PMOS transistor which forms a source/drain current path between said first source and the output parts of corresponding ones of said complementary MOS transistor blocks, and which precharge circuits simultaneously switch to an ON state during said precharging portion of said clock signal.

34. A semiconductor integrated circuit apparatus which has a plurality of logic blocks each substantially comprising MOS transistors, wherein:

at least one of said plurality of logic blocks has a completely complementary CMOS circuit comprised of a plurality of complementary MOS transistor stages each having a first block of MOS transistors of a first conductivity type which is connected to a first source and output parts and which receives input signals, and a second block of MOS transistors of a second conductivity type which is connected to said output parts and a second source and which receives said input signals, said plurality of complementary MOS transistor stages in each logic block are connected in series so that the output signals of each preceding one of said series-connected complementary MOS transistor stages are entered as input signals for respectively successive ones of said series-connected complementary MOS transistor stages;

a potential setting circuit for simultaneously setting the output signals of said series-connected complementary MOS transistor stages of a logic block to the potential of said second source in synchronization with a common clock signal is provided at each occurrence between adjacently disposed complementary MOS transistor blocks in said plurality of complementary MOS transistor blocks; and signals are propagated from a first one of said series-connected complementary MOS transistor stages to the second and successive ones of said series-connected complementary MOS transistor stages through operation of only the second blocks of MOS transistors beginning with said second block of MOS transistors in said first one of said series-connected complementary MOS transistor stages.

35. A semiconductor integrated circuit apparatus according to claim 34, wherein said potential setting circuit comprises precharge circuits each of which is connected to said first source and sets the output parts of respective ones of said complementary MOS transistor stages of a logic block to a potential of said first source in synchronization with said clock signal and an inverter which sets said output parts to be set to the potential of said first source by the precharge means to a potential of said second source.

36. A semiconductor integrated circuit apparatus according to claim 35, wherein the first block is a PMOS transistor block and the second block is an NMOS transistor block in each of said plurality of complementary MOS transistor stages, and wherein there is provided a timing control circuit which is connected between said NMOS transistor block and said second source in at least the first one of said series-connected complementary MOS transistor stages of each of said at least one of said plurality of logic blocks such that operating timings of all NMOS transistor blocks in each of said at least one of said plurality of logic blocks are in synchronization with a non-precharge portion of said clock signal of that logic block, a precharge portion of said clock signal being associated with the setting of the potential of the output signals of said series-connected complementary MOS transistor stages of a respective logic block to said second source by said potential setting circuit.

37. A semiconductor integrated circuit apparatus according to claim 36, wherein each said precharge circuit of a logic block includes a PMOS transistor which forms a source/drain current path between said first source and the output parts of corresponding ones of said complementary logic stages and which switches to an ON state during said precharge phase of that logic block, the precharge operations of adjacently disposed logic blocks occur during different time intervals of a same clock signal.

* * * * *